(12) United States Patent
Khlat

(10) Patent No.: US 9,973,147 B2
(45) Date of Patent: May 15, 2018

(54) ENVELOPE TRACKING POWER MANAGEMENT CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days. days.

(21) Appl. No.: 15/479,832

(22) Filed: Apr. 5, 2017

(65) Prior Publication Data

US 2017/0331433 A1 Nov. 16, 2017

Related U.S. Application Data

(60) Provisional application No. 62/333,938, filed on May 10, 2016.

(51) Int. Cl.
*H03F 3/04* (2006.01)
*H03F 1/02* (2006.01)
(Continued)

(52) U.S. Cl.
CPC ............ *H03F 1/0222* (2013.01); *H03F 3/19* (2013.01); *H03F 3/21* (2013.01); *H03F 1/0211* (2013.01);
(Continued)

(58) Field of Classification Search
CPC .... H03F 3/45; H03F 3/45071; H03F 3/45179; H03F 3/45183; H03F 2203/30063;
(Continued)

(56) References Cited

U.S. PATENT DOCUMENTS 3,969,682 A 7/1976 Rossum
3,980,964 A 9/1976 Grodinsky
(Continued)

FOREIGN PATENT DOCUMENTS

CN 1076567 A 9/1993
CN 1211355 A 3/1999
(Continued)

OTHER PUBLICATIONS

Non-Final Office Action for U.S. Appl. No. 15/142,859, dated Aug. 11, 2017, 7 pages.
(Continued)

*Primary Examiner* — Khanh V Nguyen
(74) *Attorney, Agent, or Firm* — Withrow & Terranova, P.L.L.C.

(57) ABSTRACT

An envelope tracking power management circuit is disclosed. An envelope tracking power management circuit includes a first envelope tracking amplifier(s) and a second envelope tracking amplifier(s), each configured to amplify a respective radio frequency (RF) signal(s) based on a respective supply voltage. A power management circuit can determine that a selected envelope tracking amplifier, which can be either the first envelope tracking amplifier(s) or the second envelope tracking amplifier(s), receives the respective supply voltage lower than a voltage required to amplify the respective RF signal(s) to a predetermined voltage. In response, the power management circuit provides a boosted voltage, which is no less than the required voltage, to the selected envelope tracking amplifier. As such, it is possible to enable the selected envelope tracking amplifier to amplify the respective RF signal(s) to the predetermined voltage without increasing cost, footprint, and power consumption of the envelope tracking power management circuit.

20 Claims, 6 Drawing Sheets

(51) Int. Cl.
*H03F 3/19* (2006.01)
*H03F 3/21* (2006.01)
*H03F 1/30* (2006.01)

(52) U.S. Cl.
CPC .......... *H03F 1/0227* (2013.01); *H03F 1/0244* (2013.01); *H03F 1/305* (2013.01); *H03F 2200/102* (2013.01); *H03F 2200/111* (2013.01); *H03F 2200/421* (2013.01); *H03F 2200/451* (2013.01)

(58) Field of Classification Search
CPC ....... H03F 2203/45244; H03F 3/45085; H03F 1/0211; H03F 1/0227; H03F 1/0244; H03F 1/305
USPC ........................................ 330/127, 261, 297
See application file for complete search history.

(56) References Cited

U.S. PATENT DOCUMENTS

| | | |
|---|---|---|
| 4,131,860 A | 12/1978 | Fyot |
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,339,041 A | 8/1994 | Nitardy |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow et al. |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,426,680 B1 | 7/2002 | Duncan et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,646,501 B1 | 11/2003 | Wessel |
| 6,658,445 B1 | 12/2003 | Gau et al. |
| 6,681,101 B1 | 1/2004 | Eidson et al. |
| 6,686,727 B2 | 2/2004 | Ledenev et al. |
| 6,690,652 B1 | 2/2004 | Sadri |
| 6,701,141 B2 | 3/2004 | Lam |
| 6,703,080 B2 | 3/2004 | Reyzelman et al. |
| 6,725,021 B1 | 4/2004 | Anderson et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,026,868 B2 | 4/2006 | Robinson et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,064,606 B2 | 6/2006 | Louis |
| 7,091,780 B2 | 8/2006 | Bienek et al. |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,391,190 B1 | 6/2008 | Rajagopalan |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,453,711 B2 | 11/2008 | Yanagida et al. |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,777,470 B2 | 8/2010 | Lindeberg et al. |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,863,828 B2 | 1/2011 | Melanson |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,917,105 B2 | 3/2011 | Drogi et al. |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |

(56) References Cited

U.S. PATENT DOCUMENTS

| | | |
|---|---|---|
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,093,953 B2 * | 1/2012 | Pierdomenico ....... H03F 1/0222 330/297 |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,358,113 B2 | 1/2013 | Cheng et al. |
| 8,362,837 B2 | 1/2013 | Koren et al. |
| 8,364,101 B2 | 1/2013 | Shizawa et al. |
| 8,446,135 B2 | 5/2013 | Chen et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,643,435 B2 | 2/2014 | Lim et al. |
| 8,648,657 B1 | 2/2014 | Rozenblit |
| 8,659,355 B2 | 2/2014 | Henshaw et al. |
| 8,692,527 B2 | 4/2014 | Ritamäki et al. |
| 8,693,676 B2 | 4/2014 | Xiao et al. |
| 8,698,558 B2 * | 4/2014 | Mathe ................... H03F 1/0227 330/251 |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,754,707 B2 * | 6/2014 | Mathe ................... H03F 1/0238 330/127 |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 * | 3/2015 | Balteanu ............... H03F 1/02 330/136 |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,088,247 B2 | 7/2015 | Arno et al. |
| 9,099,961 B2 | 8/2015 | Kay et al. |
| 9,112,452 B1 | 8/2015 | Khlat |
| 9,445,371 B2 * | 9/2016 | Khesbak ............ H04W 52/0261 |
| 9,491,314 B2 | 11/2016 | Wimpenny |
| 9,515,622 B2 * | 12/2016 | Nentwig ................. H03F 3/211 |
| 9,628,025 B2 | 4/2017 | Wimpenny |
| 9,843,294 B2 * | 12/2017 | Khlat ................... H03F 1/0227 |
| 2002/0071497 A1 | 6/2002 | Bengtsson et al. |
| 2002/0125869 A1 | 9/2002 | Groom et al. |
| 2002/0125872 A1 | 9/2002 | Groom et al. |
| 2002/0176188 A1 | 11/2002 | Ruegg et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0184713 A1 | 8/2005 | Xu et al. |
| 2005/0200407 A1 | 9/2005 | Arai et al. |
| 2005/0208907 A1 | 9/2005 | Yamazaki et al. |
| 2005/0258891 A1 | 11/2005 | Ito et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0087372 A1 | 4/2006 | Henze |
| 2006/0097711 A1 | 5/2006 | Brandt |
| 2006/0114069 A1 | 6/2006 | Kojima et al. |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2006/0270366 A1 | 11/2006 | Rozenblit et al. |
| 2007/0008757 A1 | 1/2007 | Usui et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0054635 A1 | 3/2007 | Black et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |

(56) References Cited

U.S. PATENT DOCUMENTS

| | | |
|---|---|---|
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0150620 A1 | 6/2008 | Lesso |
| 2008/0157745 A1 | 7/2008 | Nakata |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0015229 A1 | 1/2009 | Kotikalapoodi |
| 2009/0015299 A1 | 1/2009 | Ryu et al. |
| 2009/0039947 A1 | 2/2009 | Williams |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0140706 A1 | 6/2009 | Tautik et al. |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2009/0326624 A1 | 12/2009 | Melse |
| 2010/0001793 A1 | 1/2010 | Van Zeiji et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0027301 A1 | 2/2010 | Hoyerby |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0237948 A1 | 9/2010 | Nguyen et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagi |
| 2011/0018626 A1 | 1/2011 | Kojima |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0148385 A1 | 6/2011 | North et al. |
| 2011/0193629 A1 | 8/2011 | Hou et al. |
| 2011/0204959 A1 | 8/2011 | Sousa et al. |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2011/0304400 A1 | 12/2011 | Stanley |
| 2012/0025907 A1 | 2/2012 | Koo et al. |
| 2012/0025919 A1 | 2/2012 | Huynh |
| 2012/0032658 A1 | 2/2012 | Casey et al. |
| 2012/0034893 A1 | 2/2012 | Baxter et al. |
| 2012/0049818 A1 | 3/2012 | Hester |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0139641 A1 | 6/2012 | Kaczman et al. |
| 2012/0146731 A1 | 6/2012 | Khesbak |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0212197 A1 | 8/2012 | Fayed et al. |
| 2012/0236444 A1 | 9/2012 | Srivastava et al. |
| 2012/0244916 A1 | 9/2012 | Brown et al. |
| 2012/0249103 A1 | 10/2012 | Latham, II et al. |
| 2012/0269240 A1 | 10/2012 | Balteanu et al. |
| 2012/0274235 A1 | 11/2012 | Lee et al. |
| 2012/0299647 A1 | 11/2012 | Honjo et al. |
| 2012/0313701 A1 | 12/2012 | Khlat et al. |
| 2013/0024142 A1 | 1/2013 | Folkmann et al. |
| 2013/0034139 A1 | 2/2013 | Khlat et al. |
| 2013/0038305 A1 | 2/2013 | Arno et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0127548 A1 | 5/2013 | Popplewell et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0176076 A1 | 7/2013 | Riehl |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0231069 A1 | 9/2013 | Drogi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0042999 A1 | 2/2014 | Barth et al. |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184334 A1 | 7/2014 | Nobbe et al. |
| 2014/0184335 A1 | 7/2014 | Nobbe et al. |
| 2014/0184337 A1 | 7/2014 | Nobbe et al. |
| 2014/0203868 A1 | 7/2014 | Khlat et al. |
| 2014/0203869 A1 | 7/2014 | Khlat et al. |
| 2014/0218109 A1 | 8/2014 | Wimpenny |

(56) References Cited

U.S. PATENT DOCUMENTS

| | | | |
|---|---|---|---|
| 2014/0225674 A1 | 8/2014 | Folkmann et al. | |
| 2014/0232458 A1* | 8/2014 | Arno | H03F 1/0227 330/127 |
| 2014/0266427 A1 | 9/2014 | Chiron | |
| 2014/0266428 A1 | 9/2014 | Chiron et al. | |
| 2014/0266462 A1 | 9/2014 | Schirmann et al. | |
| 2014/0285164 A1 | 9/2014 | Oishi et al. | |
| 2014/0306769 A1 | 10/2014 | Khlat et al. | |
| 2015/0048891 A1 | 2/2015 | Rozek et al. | |
| 2015/0054588 A1 | 2/2015 | Wimpenny | |
| 2015/0097624 A1 | 4/2015 | Olson et al. | |
| 2015/0123733 A1 | 5/2015 | Wimpenny et al. | |
| 2015/0180422 A1 | 6/2015 | Khlat et al. | |
| 2015/0234402 A1 | 8/2015 | Kay et al. | |
| 2015/0270806 A1 | 9/2015 | Wagh et al. | |
| 2015/0333781 A1 | 11/2015 | Alon et al. | |
| 2016/0380597 A1 | 12/2016 | Midya | |

FOREIGN PATENT DOCUMENTS

| | | |
|---|---|---|
| CN | 1443395 A | 9/2003 |
| CN | 1518209 A | 8/2004 |
| CN | 1592089 A | 3/2005 |
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| CN | 102403967 A | 4/2012 |
| EP | 0755121 A2 | 1/1997 |
| EP | 1047188 A2 | 10/2000 |
| EP | 1317105 A1 | 6/2003 |
| EP | 1383235 A1 | 1/2004 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| JP | 2010166157 A | 7/2010 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Non-Final Office Action for U.S. Appl. No. 13/876,518, dated Aug. 10, 2017, 19 pages.
Extended European Search Report for European Patent Application No. 16204437.4, dated Sep. 14, 2017, 17 pages.
U.S. Appl. No. 11/534,072, filed Sep. 21, 2006, now U.S. Pat. No. 7,773,965.
U.S. Appl. No. 12/112,006, filed Apr. 30, 2008, now U.S. Pat. No. 7,884,681.
U.S. Appl. No. 12/836,307, filed Jul. 14, 2010, now U.S. Pat. No. 9,112,452.
U.S. Appl. No. 13/089,917, filed Apr. 19, 2011, now U.S. Pat. No. 8,493,141.
U.S. Appl. No. 13/948,291, filed Jul. 23, 2013, now U.S. Pat. No. 9,197,165.
U.S. Appl. No. 14/638,374, filed Mar. 4, 2015.
U.S. Appl. No. 13/188,024, filed Jul. 21, 2011, now U.S. Pat. No. 8,571,498.
U.S. Appl. No. 13/218,400, filed Aug. 25, 2011, now U.S. Pat. No. 8,519,788.
U.S. Appl. No. 13/876,518, filed Mar. 28, 2013.
U.S. Appl. No. 13/297,490, filed Nov. 16, 2011, now U.S. Pat. No. 8,782,107.
U.S. Appl. No. 13/297,470, filed Nov. 16, 2011, now U.S. Pat. No. 9,075,673.
U.S. Appl. No. 14/101,770, filed Dec. 10, 2013.
U.S. Appl. No. 14/022,858, filed Sep. 10, 2013, now U.S. Pat. No. 9,099,011.
U.S. Appl. No. 14/151,167, filed Jan. 9, 2014, now U.S. Pat. No. 9,401,678.
U.S. Appl. No. 13/343,840, filed Jan. 5, 2012, now U.S. Pat. No. 8,588,713.
U.S. Appl. No. 13/363,888, filed Feb. 1, 2012, now U.S. Pat. No. 8,611,402.
U.S. Appl. No. 13/222,453, filed Aug. 31, 2011, now U.S. Pat. No. 8,618,868.
U.S. Appl. No. 13/367,973, filed Feb. 7, 2012, now U.S. Pat. No. 8,942,313.
U.S. Appl. No. 13/423,649, filed Mar. 19, 2012, now U.S. Pat. No. 8,624,760.
U.S. Appl. No. 14/072,140, filed Nov. 5, 2013, now U.S. Pat. No. 9,246,460.
U.S. Appl. No. 13/316,229, filed Dec. 9, 2011, now U.S. Pat. No. 8,633,766.
U.S. Appl. No. 14/072,225, filed Nov. 5, 2013.
U.S. Appl. No. 14/072,120, filed Nov. 5, 2013, now U.S. Pat. No. 9,247,496.
U.S. Appl. No. 14/122,852, filed Nov. 27, 2013, now U.S. Pat. No. 9,178,627.
U.S. Appl. No. 13/486,012, filed Jun. 1, 2012, now U.S. Pat. No. 9,019,011.
U.S. Appl. No. 13/531,719, filed Jun. 25, 2012, now U.S. Pat. No. 8,760,228.
U.S. Appl. No. 13/548,283, filed Jul. 13, 2012, now U.S. Pat. No. 8,952,710.
U.S. Appl. No. 13/550,049, filed Jul. 16, 2012, now U.S. Pat. No. 8,792,740.
U.S. Appl. No. 13/550,060, filed Jul. 16, 2012, now U.S. Pat. No. 8,626,091.
U.S. Appl. No. 13/552,768, filed Jul. 19, 2012, now U.S. Pat. No. 9,263,996.
U.S. Appl. No. 13/222,484, filed Aug. 31, 2011, now U.S. Pat. No. 8,624,576.
U.S. Appl. No. 13/602,856, filed Sep. 4, 2012, now U.S. Pat. No. 8,942,652.
U.S. Appl. No. 13/647,815, filed Oct. 9, 2012, now U.S. Pat. No. 8,957,728.
U.S. Appl. No. 13/689,883, filed Nov. 30, 2012.
U.S. Appl. No. 13/661,164, filed Oct. 26, 2012, now U.S. Pat. No. 9,294,041.
U.S. Appl. No. 13/661,552, filed Oct. 26, 2012, now U.S. Pat. No. 8,878,606.
U.S. Appl. No. 13/661,227, filed Oct. 26, 2012.
U.S. Appl. No. 13/689,922, filed Nov. 30, 2012.
U.S. Appl. No. 13/692,084, filed Dec. 3, 2012, now U.S. Pat. No. 8,947,161.
U.S. Appl. No. 13/690,187, filed Nov. 30, 2012, now U.S. Pat. No. 9,041,364.
U.S. Appl. No. 13/684,826, filed Nov. 26, 2012, now U.S. Pat. No. 8,975,959.

(56) References Cited

OTHER PUBLICATIONS

U.S. Appl. No. 13/689,940, filed Nov. 30, 2012, now U.S. Pat. No. 9,250,643.
U.S. Appl. No. 14/022,940, filed Sep. 10, 2013, now U.S. Pat. No. 8,981,848.
U.S. Appl. No. 13/714,600, filed Dec. 14, 2012.
U.S. Appl. No. 13/727,911, filed Dec. 27, 2012, now U.S. Pat. No. 9,298,198.
U.S. Appl. No. 13/782,142, filed Mar. 1, 2013, now U.S. Pat. No. 9,024,688.
U.S. Appl. No. 13/747,694, filed Jan. 23, 2013, now U.S. Pat. No. 9,041,365.
U.S. Appl. No. 14/702,192, mailed May 1, 2015.
U.S. Appl. No. 13/914,888, filed Jun. 11, 2013, now U.S. Pat. No. 8,981,839.
U.S. Appl. No. 14/027,416, filed Sep. 16, 2013, now U.S. Pat. No. 9,225,231.
U.S. Appl. No. 13/951,976, filed Jul. 26, 2013, now U.S. Pat. No. 9,020,451.
U.S. Appl. No. 14/048,109, filed Oct. 8, 2013, now U.S. Pat. No. 9,197,256.
U.S. Appl. No. 14/056,292, filed Oct. 17, 2013, now U.S. Pat. No. 9,207,692.
U.S. Appl. No. 14/082,629, filed Nov. 18, 2013.
U.S. Appl. No. 13/747,725, filed Jan. 23, 2013, now U.S. Pat. No. 9,280,163.
U.S. Appl. No. 13/747,749, filed Jan. 23, 2013, now U.S. Pat. No. 9,256,234.
U.S. Appl. No. 14/163,229, filed Jan. 24, 2014, now U.S. Pat. No. 9,300,252.
U.S. Appl. No. 14/176,611, filed Feb. 10, 2014, now U.S. Pat. No. 9,178,472.
U.S. Appl. No. 14/212,154, filed Mar. 14, 2014, now U.S. Pat. No. 9,203,353.
U.S. Appl. No. 14/212,199, filed Mar. 14, 2014, now U.S. Pat. No. 9/197,162.
U.S. Appl. No. 14/254,215, filed Apr. 16, 2014.
U.S. Appl. No. 14/458,341, filed Aug. 13, 2014, now U.S. Pat. No. 9,374,005.
U.S. Appl. No. 14/163,256, filed Jan. 24, 2014.
U.S. Appl. No. 14/789,464, filed Jul. 1, 2015.
U.S. Appl. No. 15/142,634, filed Apr. 29, 2016.
U.S. Appl. No. 15/142,725, filed Apr. 29, 2016.
U.S. Appl. No. 15/195,050, filed Jun. 28, 2016.
U.S. Appl. No. 15/142,859, filed Apr. 29, 2016.
Final Office Action for U.S. Appl. No. 13/297,470, dated Oct. 25, 2013, 17 pages.
Non-Final Office Action for U.S. Appl. No. 13/297,470, dated Feb. 20, 2014, 16 pages.
International Search Report for PCT/US2011/061009, dated Feb. 8, 2012, 14 pages.
International Preliminary Report on Patentability for PCT/US2011/061009, dated May 30, 2013, 10 pages.
Notice of Allowance for U.S. Appl. No. 14/022,858, dated Oct. 25, 2013, 9 pages.
Notice of Allowance for U.S. Appl. No. 14/022,858, dated May 27, 2014, 6 pages.
Notice of Allowance for U.S. Appl. No. 13/343,840, dated Jul. 1, 2013, 8 pages.
International Search Report for PCT/US2012/023495, dated May 7, 2012, 13 pages.
International Preliminary Report on Patentability for PCT/US2012/023495, dated Aug. 15, 2013, 10 pages.
Notice of Allowance for U.S. Appl. No. 13/363,888, dated Jul. 18, 2013, 9 pages.
Non-final Office Action for U.S. Appl. No. 13/222,453, dated Dec. 6, 2012, 13 pages.
Notice of Allowance for U.S. Appl. No. 13/222,453, dated Feb. 21, 2013, 7 pages.
Notice of Allowance for U.S. Appl. No. 13/222,453, dated Aug. 22, 2013, 8 pages.
Non-Final Office Action for U.S. Appl. No. 13/367,973, dated Sep. 24, 2013, 8 pages.
Non-Final Office Action for U.S. Appl. No. 13/367,973, dated Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, dated Aug. 24, 2012, 14 pages.
International Preliminary Report on Patentability for PCT/US2012/024124, dated Aug. 22, 2013, 8 pages.
Non-Final Office Action for U.S. Appl. No. 13/423,649, dated May 22, 2013, 7 pages.
Notice of Allowance for U.S. Appl. No. 13/423,649, dated Aug. 30, 2013, 8 pages.
Notice of Allowance for U.S. Appl. No. 14/072,140, dated Aug. 27, 2014, 8 pages.
Notice of Allowance for U.S. Appl. No. 13/316,229, dated Nov. 14, 2012, 9 pages.
Notice of Allowance for U.S. Appl. No. 13/316,229, dated Aug. 29, 2013, 8 pages.
International Search Report for PCT/US2011/064255, dated Apr. 3, 2012, 12 pages.
International Preliminary Report on Patentability for PCT/US2011/064255, dated Jun. 20, 2013, 7 pages.
Non-Final Office Action for U.S. Appl. No. 14/072,225, dated Aug. 15, 2014, 4 pages.
International Search Report for PCT/US2012/40317, dated Sep. 7, 2012, 7 pages.
International Preliminary Report on Patentability for PCT/US2012/040317, dated Dec. 12, 2013, 5 pages.
Non-Final Office Action for U.S. Appl. No. 13/486,012, dated Jul. 28, 2014, 7 pages.
Quayle Action for U.S. Appl. No. 13/531,719, dated Oct. 10, 2013, 5 pages.
Notice of Allowance for U.S. Appl. No. 13/531,719, dated Dec. 30, 2013, 7 pages.
Notice of Allowance for U.S. Appl. No. 13/548,283, dated Sep. 3, 2014, 7 pages.
Non-Final Office Action for U.S. Appl. No. 13/550,049, dated Nov. 25, 2013, 6 pages.
Notice of Allowance for U.S. Appl. No. 13/550,049, dated Mar. 6, 2014, 5 pages.
International Search Report for PCT/US2012/046887, dated Dec. 21, 2012, 12 pages.
International Preliminary Report on Patentability for PCT/US2012/046887, dated Jan. 30, 2014, 8 pages.
Notice of Allowance for U.S. Appl. No. 13/550,060, dated Aug. 16, 2013, 8 pages.
Non-final Office Action for U.S. Appl. No. 13/222,484, dated Nov. 8, 2012, 9 pages.
Final Office Action for U.S. Appl. No. 13/222,484, dated Apr. 10, 2013, 10 pages.
Advisory Action for U.S. Appl. No. 13/222,484, dated Jun. 14, 2013, 3 pages.
Notice of Allowance for U.S. Appl. No. 13/222,484, dated Aug. 26, 2013, 8 pages.
Notice of Allowance for U.S. Appl. No. 13/602,856, dated Sep. 24, 2013, 9 pages.
International Search Report and Written Opinion for PCT/US2012/053654, dated Feb. 15, 2013, 11 pages.
International Preliminary Report on Patentability for PCT/US2012/053654, dated Mar. 13, 2014, 7 pages.
Non-Final Office Action for U.S. Appl. No. 13/647,815, dated May 2, 2014, 6 pages.
Non-Final Office Action for U.S. Appl. No. 13/689,883, dated Mar. 27, 2014, 13 pages.
Non-Final Office Action for U.S. Appl. No. 13/689,883, dated Aug. 27, 2014, 12 pages.
International Search Report and Written Opinion for PCT/US2012/062070, dated Jan. 21, 2013, 12 pages.

(56) References Cited

OTHER PUBLICATIONS

International Preliminary Report on Patentability for PCT/US2012/062070, dated May 8, 2014, 8 pages.
Non-Final Office Action for U.S. Appl. No. 13/661,552, dated Feb. 21, 2014, 5 pages.
Non-Final Office Action for U.S. Appl. No. 12/836,307, dated Sep. 25, 2014, 5 pages.
Notice of Allowance for U.S. Appl. No. 12/836,307, dated Mar. 2, 2015, 6 pages.
Notice of Allowance for U.S. Appl. No. 13/948,291, dated Feb. 11, 2015, 7 pages.
First Office Action for Chinese Patent Application No. 201180030273.5, dated Dec. 3, 2014, 15 pages (with English translation).
European Examination Report for European Patent Application No. 14162682.0, dated May 22, 2015, 5 pages.
Advisory Action for U.S. Appl. No. 13/297,470, dated Sep. 19, 2014, 3 pages.
Non-Final Office Action for U.S. Appl. No. 13/297,470, dated Oct. 20, 2014, 22 pages.
Notice of Allowance for U.S. Appl. No. 13/297,470, dated Feb. 25, 2015, 15 pages.
Corrected Notice of Allowance for U.S. Appl. No. 13/297,470, dated Apr. 6, 2015, 11 pages.
Notice of Allowance for U.S. Appl. No. 14/022,858, dated Feb. 17, 2015, 7 pages.
Notice of Allowance for U.S. Appl. No. 13/367,973, dated Sep. 15, 2014, 7 pages.
Notice of Allowance for U.S. Appl. No. 14/072,140, dated Dec. 2, 2014, 8 pages.
Extended European Search Report for European Patent Application No. 14190851.7, dated Mar. 5, 2015, 6 pages.
Notice of Allowance for U.S. Appl. No. 14/072,225, dated Jan. 22, 2015, 7 pages.
Non-Final Office Action for U.S. Appl. No. 14/122,852, dated Feb. 27, 2015, 5 pages.
First Office Action for Chinese Patent Application No. 201280026559.0, dated Nov. 3, 2014, 14 pages (with English translation).
Extended European Search Report for European Patent Application No. 12794149.0, dated Oct. 29, 2014, 6 pages.
Notice of Allowance for U.S. Appl. No. 13/486,012, dated Nov. 21, 2014, 8 pages.
Notice of Allowance for U.S. Appl. No. 13/647,815, dated Sep. 19, 2014, 6 pages.
Final Office Action for U.S. Appl. No. 13/689,883, dated Jan. 2, 2015, 13 pages.
Advisory Action for U.S. Appl. No. 13/689,883, dated Apr. 20, 2015, 3 pages.
Non-Final Office Action for U.S. Appl. No. 13/661,227, dated Sep. 29, 2014, 24 pages.
Final Office Action for U.S. Appl. No. 13/661,227, dated Feb. 6, 2015, 24 pages.
Advisory Action for U.S. Appl. No. 13/661,227, dated May 12, 2015, 3 pages.
Notice of Allowance for U.S. Appl. No. 13/690,187, dated Dec. 19, 2014, 8 pages.
Notice of Allowance for U.S. Appl. No. 13/684,826, dated Sep. 8, 2014, 6 pages.
Non-Final Office Action for U.S. Appl. No. 13/714,600, dated Oct. 15, 2014, 13 pages.
Final Office Action for U.S. Appl. No. 13/714,600, dated Mar. 10, 2015, 14 pages.
Advisory Action for U.S. Appl. No. 13/714,600, dated May 26, 2015, 3 pages.
Notice of Allowance for U.S. Appl. No. 13/747,694, dated Dec. 22, 2014, 9 pages.
Notice of Allowance for U.S. Appl. No. 13/914,888, dated Oct. 17, 2014, 10 pages.
Notice of Allowance for U.S. Appl. No. 13/951,976, dated Dec. 26, 2014, 9 pages.
International Preliminary Report on Patentability for PCT/US2013/052277, dated Feb. 5, 2015, 9 pages.
Non-Final Office Action for U.S. Appl. No. 14/048,109, dated Feb. 18, 2015, 8 pages.
Non-Final Office Action for U.S. Appl. No. 14/056,292, dated Mar. 6, 2015, 8 pages.
Non-Final Office Action for U.S. Appl. No. 13/747,725, dated Oct. 7, 2014, 6 pages.
Notice of Allowance for U.S. Appl. No. 13/747,725, dated Feb. 2, 2015, 10 pages.
Notice of Allowance for U.S. Appl. No. 13/747,725, dated May 13, 2015, 9 pages.
Non-Final Office Action for U.S. Appl. No. 13/747,749, dated Nov. 12, 2014, 32 pages.
Final Office Action for U.S. Appl. No. 13/747,749, dated Mar. 20, 2015, 35 pages.
Non-Final Office Action for U.S. Appl. No. 14/072,120, dated Apr. 14, 2015, 8 pages.
Non-Final Office Action for U.S. Appl. No. 13/552,768, dated Apr. 20, 2015, 12 pages.
Non-Final Office Action for U.S. Appl. No. 13/689,922, dated Apr. 20, 2015, 19 pages.
Non-Final Office Action for U.S. Appl. No. 13/727,911, dated Apr. 20, 2015, 10 pages.
Non-Final Office Action for U.S. Appl. No. 14/163,229, dated Apr. 23, 2015, 9 pages.
Non-Final Office Action for U.S. Appl. No. 14/163,256, dated Apr. 23, 2015, 9 pages.
Notice of Allowance for U.S. Appl. No. 14/176,611, dated Apr. 27, 2015, 7 pages.
International Preliminary Report on Patentability for PCT/US2013/065403, dated Apr. 30, 2015, 8 pages.
Non-Final Office Action for U.S. Appl. No. 13/689,940, dated May 14, 2015, 7 pages.
International Search Report and Written Opinion for PCT/US2014/012927, dated Sep. 30, 2014, 11 pages.
Notice of Allowance for U.S. Appl. No. 13/661,552, dated Jun. 13, 2014, 5 pages.
International Search Report and Written Opinion for PCT/US2012/062110, dated Apr. 8, 2014, 12 pages.
International Preliminary Report on Patentability for PCT/US2012/062110, dated May 8, 2014, 9 pages.
Non-Final Office Action for U.S. Appl. No. 13/692,084, dated Apr. 10, 2014, 6 pages.
Notice of Allowance for U.S. Appl. No. 13/692,084, dated Jul. 23, 2014, 7 pages.
Notice of Allowance for U.S. Appl. No. 13/690,187, dated Sep. 3, 2014, 9 pages.
International Search Report and Written Opinion for PCT/US2012/067230, dated Feb. 21, 2013, 10 pages.
International Preliminary Report on Patentability and Written Opinion for PCT/US2012/067230, dated Jun. 12, 2014, 7 pages.
Non-Final Office Action for U.S. Appl. No. 13/684,826, dated Apr. 3, 2014, 5 pages.
Notice of Allowance for U.S. Appl. No. 13/684,826, dated Jul. 18, 2014, 7 pages.
Non-Final Office Action for U.S. Appl. No. 14/022,940, dated Dec. 20, 2013, 5 pages.
Notice of Allowance for U.S. Appl. No. 14/022,940, dated Jun. 10, 2014, 7 pages.
Non-Final Office Action for U.S. Appl. No. 13/714,600, dated May 9, 2014, 14 pages.
Non-Final Office Action for U.S. Appl. No. 13/782,142, dated Sep. 4, 2014, 6 pages.
Non-Final Office Action for U.S. Appl. No. 13/951,976, dated Apr. 4, 2014, 7 pages.
International Search Report and Written Opinion for PCT/US2013/052277, dated Jan. 7, 2014, 14 pages.
International Search Report and Written Opinion for PCT/US2013/065403, dated Feb. 5, 2014, 11 pages.

(56) References Cited

OTHER PUBLICATIONS

International Search Report and Written Opinion for PCT/US2014/028089, dated Jul. 17, 2014, 10 pages.
Invitation to Pay Additional Fees and Partial International Search Report for PCT/US2014/028178, dated Jul. 24, 2014, 7 pages.
International Search Report and Written Opinion for PCT/US2014/028178, dated Sep. 30, 2014, 17 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 13/948,291, dated Jul. 17, 2015, 8 pages.
Corrected Notice of Allowance for U.S. Appl. No. 13/297,470, dated Jun. 5, 2015, 11 pages.
Notice of Allowance for U.S. Appl. No. 14/072,140, dated Aug. 20, 2015, 6 pages.
Non-Final Office Action for U.S. Appl. No. 14/072,225, dated Aug. 18, 2015, 4 pages.
Non-Final Office Action for U.S. Appl. No. 13/689,883, dated Jul. 24, 2015, 13 pages.
Non-Final Office Action for U.S. Appl. No. 13/661,227, dated Jul. 27, 2015, 25 pages.
Non-Final Office Action for U.S. Appl. No. 13/714,600, dated Jul. 17, 2015, 14 pages.
Notice of Allowance for U.S. Appl. No. 14/212,154, dated Jul. 17, 2015, 8 pages.
Notice of Allowance for U.S. Appl. No. 14/212,199, dated Jul. 20, 2015, 8 pages.
Notice of Allowance for U.S. Appl. No. 13/747,725, dated Sep. 1, 2015, 9 pages.
Notice of Allowance for U.S. Appl. No. 13/747,749, dated Jun. 4, 2015, 8 pages.
Notice of Allowance for U.S. Appl. No. 14/072,120, dated Jul. 30, 2015, 7 pages.
Notice of Allowance for U.S. Appl. No. 14/027,416, dated Aug. 11, 2015, 9 pages.
Notice of Allowance for U.S. Appl. No. 13/689,940, dated Aug. 3, 2015, 6 pages.
Notice of Allowance for U.S. Appl. No. 13/661,164, dated Jun. 3, 2015, 6 pages.
Non-Final Office Action for U.S. Appl. No. 14/082,629, dated Jun. 18, 2015, 15 pages.
First Office Action for Chinese Patent Application No. 201280052694.2, dated Mar. 24, 2015, 35 pages.
First Office Action and Search Report for Chinese Patent Application No. 201280007941.7, dated May 13, 2015, 13 pages.
International Preliminary Report on Patentability for PCT/US2014/012927, dated Aug. 6, 2015, 9 pages.
First Office Action and Search Report for Chinese Patent Application No. 201210596632.X, dated Jun. 25, 2015, 16 pages.
Notice of Allowance for U.S. Appl. No. 14/638,374, dated Aug. 30, 2016, 7 pages.
Invitation pursuant to Article 94(3) and Rule 71(1) EPC for European Patent Application No. 14162658.0, mailed Jun. 29, 2017, 4 pages.
Final Office Action for U.S. Appl. No. 13/714,600, dated Oct. 5, 2016, 15 pages.
Advisory Action for U.S. Appl. No. 13/714,600, dated Dec. 16, 2016, 3 pages.
Non-Final Office Action for U.S. Appl. No. 13/714,600, dated Feb. 16, 2017, 14 pages.
Notice of Allowance for U.S. Appl. No. 13/714,600, dated Jun. 29, 2017, 8 pages.
First Office Action for Chinese Patent Application No. 201380039592.1, dated Oct. 31, 2016, 13 pages.
Notice of Allowance for U.S. Appl. No. 14/163,256, dated Feb. 21, 2017, 7 pages.
Notice of Allowance for U.S. Appl. No. 14/789,464, dated Oct. 26, 2016, 7 pages.

Author Unknown, "Automatically," Definition, Dictionary.com Unabridged, 2015, pp. 1-6, http://dictionary.reference.com/browse/automatically.
Wang, Feipeng et al., An Improved Power-Added Efficiency 19-dBm Hybrid Envelope Elimination and Restoration Power Amplifier for 802.11g WLAN Applications, IEEE Transactions on Microwave Theory and Techniques, vol. 54, No. 12, Dec. 2006, pp. 4086-4099.
Second Office Action for Chinese Patent Application No. 201180030273.5, dated Aug. 14, 2015, 8 pages.
Examination Report for European Patent Application No. 14190851.7, dated May 2, 2016, 5 pages.
Notice of Allowance for U.S. Appl. No. 14/072,225, dated Feb. 3, 2016, 7 pages.
Final Office Action for U.S. Appl. No. 13/689,883, dated Dec. 23, 2015, 12 pages.
Advisory Action for U.S. Appl. No. 13/689,883, dated Mar. 4, 2016, 3 pages.
Non-Final Office Action for U.S. Appl. No. 13/689,883, dated Apr. 20, 2016, 13 pages.
First Office Action for Chinese Patent Application No. 201280042523.1, dated Dec. 4, 2015, 12 pages.
First Office Action for Chinese Patent Application No. 201280052739.6, dated Mar. 3, 2016, 31 pages.
Final Office Action for U.S. Appl. No. 13/661,227, dated Feb. 9, 2016, 28 pages.
Notice of Allowance and Examiner Initiated Interview Summary for U.S. Appl. No. 13/661,227, dated May 13, 2016, 10 pages.
Final Office Action for U.S. Appl. No. 13/714,600, dated Dec. 24, 2015, 15 pages.
Advisory Action for U.S. Appl. No. 13/714,600, dated Mar. 14, 2016, 3 pages.
Non-Final Office Action for U.S. Appl. No. 13/714,600, dated May 4, 2016, 14 pages.
Notice of Allowance for U.S. Appl. No. 13/747,725, dated Oct. 28, 2015, 9 pages.
Notice of Allowance for U.S. Appl. No. 13/747,749, dated Oct. 2, 2015, 8 pages.
Notice of Allowance for U.S. Appl. No. 13/552,768, dated Sep. 22, 2015, 9 pages.
Final Office Action for U.S. Appl. No. 13/689,922, dated Oct. 6, 2015, 20 pages.
Advisory Action for U.S. Appl. No. 13/689,922, dated Dec. 18, 2015, 3 pages.
Notice of Allowance for U.S. Appl. No. 13/689,922, dated Mar. 18, 2016, 9 pages.
Notice of Allowance for U.S. Appl. No. 13/727,911, dated Sep. 14, 2015, 8 pages.
Notice of Allowance for U.S. Appl. No. 13/727,911, dated Nov. 10, 2015, 8 pages.
Notice of Allowance for U.S. Appl. No. 14/163,229, dated Nov. 5, 2015, 8 pages.
Final Office Action for U.S. Appl. No. 14/163,256, dated Nov. 2, 2015, 10 pages.
Notice of Allowance for U.S. Appl. No. 14/163,256, dated Feb. 10, 2016, 8 pages.
Notice of Allowance for U.S. Appl. No. 13/689,940, dated Sep. 16, 2015, 7 pages.
Corrected Notice of Allowability for U.S. Appl. No. 13/689,940, dated Nov. 17, 2015, 4 pages.
Non-Final Office Action for U.S. Appl. No. 14/101,770, dated Sep. 21, 2015, 5 pages.
Notice of Allowance for U.S. Appl. No. 14/101,770, dated Apr. 11, 2016, 6 pages.
Notice of Allowance for U.S. Appl. No. 14/151,167, dated Mar. 4, 2016, 7 pages.
Notice of Allowance for U.S. Appl. No. 13/661,164, dated Oct. 21, 2015, 7 pages.
Final Office Action for U.S. Appl. No. 14/082,629, dated Nov. 4, 2015, 17 pages.
Advisory Action for U.S. Appl. No. 14/082,629, dated Jan. 22, 2016, 3 pages.

(56) References Cited

OTHER PUBLICATIONS

Non-Final Office Action for U.S. Appl. No. 14/082,629, dated Mar. 16, 2016, 23 pages.
Non-Final Office Action for U.S. Appl. No. 14/702,192, dated Oct. 7, 2015, 7 pages.
Notice of Allowance for U.S. Appl. No. 14/702,192, dated Feb. 22, 2016, 8 pages.
Non-Final Office Action for U.S. Appl. No. 14/254,215, dated Oct. 15, 2015, 5 pages.
Notice of Allowance for U.S. Appl. No. 14/254,215, dated Feb. 18, 2016, 7 pages.
Non-Final Office Action for U.S. Appl. No. 14/458,341, dated Nov. 12, 2015, 5 pages.
Notice of Allowance for U.S. Appl. No. 14/458,341, dated Feb. 18, 2016, 6 pages.
Non-Final Office Action for U.S. Appl. No. 13/876,518, dated Jan. 20, 2016, 16 pages.
Final Office Action for U.S. Appl. No. 13/876,518, dated Jun. 2, 2016, 14 pages.
International Preliminary Report on Patentability for PCT/US2014/028089, dated Sep. 24, 2015, 8 pages.
International Preliminary Report on Patentability for PCT/US2014/028178, dated Sep. 24, 2015, 11 pages.
First Office Action for Chinese Patent Application No. 201180067293.X, dated Aug. 6, 2015, 13 pages.
Communication under Rule 164(2)(a) EPC for European Patent Application No. 12725911.7, mailed Feb. 17, 2016, 8 pages.
Combined Search and Examination Report for European Patent Application No. 12725911.7, dated Jun. 15, 2016, 14 pages.
Notice of Allowance for U.S. Appl. No. 13/689,883, dated Jul. 27, 2016, 9 pages.
Advisory Action for U.S. Appl. No. 13/876,518, dated Aug. 15, 2016, 3 pages.
Non-Final Office Action for U.S. Appl. No. 15/142,634, dated Jan. 20, 2017, 6 pages.
Non-Final Office Action for U.S. Appl. No. 15/142,725, dated Jul. 21, 2017, 7 pages.
Notice of Allowance for U.S. Appl. No. 15/195,050, dated May 18, 2017, 7 pages.
Final Office Action for U.S. Appl. No. 14/082,629, dated Sep. 8, 2016, 13 pages.
Notice of Allowance and Examiner Initiated Interview Summary for U.S. Appl. No. 14/082,629, dated Dec. 7, 2016, 11 pages.
Non-Final Office Action and Examiner Initiated Interview Summary for U.S. Appl. No. 13/876,518, dated Sep. 22, 2016, 18 pages.
Final Office Action for U.S. Appl. No. 13/876,518, dated Mar. 9, 2017, 18 pages.
Advisory Action for U.S. Appl. No. 13/876,518, dated May 17, 2017, 3 pages.
Invitation Pursuant to Rule 137(4) EPC and Article 94(3) EPC for European Patent Application No. 12725911.7, mailed Jan. 2, 2017, 2 pages.
Communication Pursuant to Article 94(3) EPC for European Patent Application No. 12725911.7, mailed May 24, 2017, 6 pages.
Partial European Search Report for European Patent Application No. 16204437.4, dated Apr. 12, 2017, 9 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousehadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for U.S. Appl. No. 11/113,873, now U.S. Pat. No. 7,773,691, dated Feb. 1, 2008, 17 pages.
Final Office Action for U.S. Appl. No. 11/113,873, now U.S. Pat. No. 7,773,691, dated Jul. 30, 2008, 19 pages.
Non-final Office Action for U.S. Appl. No. 11/113,873, now U.S. Pat. No. 7,773,691, dated Nov. 26, 2008, 22 pages.
Final Office Action for U.S. Appl. No. 11/113,873, now U.S. Pat. No. 7,773,691, dated May 4, 2009, 20 pages.
Non-final Office Action for U.S. Appl. No. 11/113,873, now U.S. Pat. No. 7,773,691, dated Feb. 3, 2010, 21 pages.
Notice of Allowance for U.S. Appl. No. 11/113,873, now U.S. Pat. No. 7,773,691, dated Jun. 9, 2010, 7 pages.
International Search Report for PCT/US06/12619, dated May 8, 2007, 2 pages.
Extended European Search Report for application 06740532.4, dated Dec. 7, 2010, 7 pages.
Non-final Office Action for U.S. Appl. No. 12/112,006, dated Apr. 5, 2010, 6 pages.

(56) References Cited

OTHER PUBLICATIONS

Notice of Allowance for U.S. Appl. No. 12/112,006, dated Jul. 19, 2010, 6 pages.
Non-Final Office Action for U.S. Appl. No. 12/836,307, dated Nov. 5, 2013, 6 pages.
Notice of Allowance for U.S. Appl. No. 12/836,307, dated May 5, 2014, 6 pages.
Non-final Office Action for U.S. Appl. No. 13/089,917, dated Nov. 23, 2012, 6 pages.
Examination Report for European Patent Application No. 11720630, dated Aug. 16, 2013, 5 pages.
Examination Report for European Patent Application No. 11720630.0, dated Mar. 18, 2014, 4 pages.
European Search Report for European Patent Application No. 14162682.0, dated Aug. 27, 2014, 7 pages.
International Search Report for PCT/US11/033037, dated Aug. 9, 2011, 10 pages.
International Preliminary Report on Patentability for PCT/US2011/033037, dated Nov. 1, 2012, 7 pages.
Non-Final Office Action for U.S. Appl. No. 13/188,024, dated Feb. 5, 2013, 8 pages.
Notice of Allowance for U.S. Appl. No. 13/188,024, dated Jun. 18, 2013, 8 pages.
International Search Report for PCT/US2011/044857, dated Oct. 24, 2011, 10 pages.
International Preliminary Report on Patentability for PCT/US2011/044857, dated Mar. 7, 2013, 6 pages.
Non-final Office Action for U.S. Appl. No. 13/218,400, dated Nov. 8, 2012, 7 pages.
Notice of Allowance for U.S. Appl. No. 13/218,400, dated Apr. 11, 2013, 7 pages.
International Search Report for PCT/US11/49243, dated Dec. 22, 2011, 9 pages.
International Preliminary Report on Patentability for PCT/US11/49243, dated Nov. 13, 2012, 33 pages.
International Search Report for PCT/US2011/054106, dated Feb. 9, 2012, 11 pages.
International Preliminary Report on Patentability for PCT/US2011/054106, dated Apr. 11, 2013, 8 pages.
Notice of Allowance for U.S. Appl. No. 13/297,490, dated Feb. 27, 2014, 7 pages.
Invitation to Pay Additional Fees for PCT/US2011/061007, mailed Feb. 13, 2012, 7 pages.
International Search Report for PCT/US2011/061007, dated Aug. 16, 2012, 16 pages.
International Preliminary Report on Patentability for PCT/US2011/061007, dated May 30, 2013, 11 pages.
Non-Final Office Action for U.S. Appl. No. 13/297,470, dated May 8, 2013, 15 pages.
Notice of Allowance for U.S. Appl. No. 14/163,256, dated Dec. 21, 2017, 7 pages.
Notice of Allowance for U.S. Appl. No. 15/142,725, dated Nov. 22, 2017, 7 pages.
Notice of Allowance for U.S. Appl. No. 15/142,859, dated Dec. 7, 2017, 7 pages.
Notice of Allowance for U.S. Appl. No. 13/876,518, dated Dec. 6, 2017, 7 pages.
Notice of Allowability for U.S. Appl. No. 15/195,050, dated Feb. 5, 2018, 3 pages.

\* cited by examiner

US 9,973,147 B2

ENVELOPE TRACKING POWER MANAGEMENT CIRCUIT

RELATED APPLICATIONS

This application claims the benefit of U.S. Provisional Patent Application Ser. No. 62/333,938, filed May 10, 2016, which is incorporated herein by reference in its entirety.

FIELD OF THE DISCLOSURE

The technology of the disclosure relates generally to power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data throughput and improved robustness enabled by such wireless communication technologies as multi-carrier aggregation and/or multiple-input multiple-output (MIMO). As such, a mobile communication device typically includes multiple transmission paths and/or antennas to support multi-carrier aggregation and/or MIMO. In addition, sophisticated radio frequency (RF) power amplifiers (PAs) are employed to increase average output power of RF signals (e.g., maintaining sufficient energy per bit) communicated by mobile communication device via the multiple transmission paths and/or antennas.

However, the increased average output power of RF signals can lead to increased power consumption and thermal dissipation in mobile communication devices, thus compromising overall performance of the mobile communication device. As such, the mobile communication device may also employ envelope tracking technology to help improve efficiency levels of the RF PAs. In this regard, it may be desired to provide a high-efficiency envelope tracking power management system in the mobile communication device to manage the RF PAs during multi-carrier aggregation and/or MIMO operations.

SUMMARY

Aspects disclosed in the detailed description include an envelope tracking power management circuit. An envelope tracking power management circuit includes a first envelope tracking amplifier(s) and a second envelope tracking amplifier(s), each configured to amplify a respective radio frequency (RF) signal(s) based on a respective supply voltage. A power management circuit can determine that a selected envelope tracking amplifier, which can be either the first envelope tracking amplifier(s) or the second envelope tracking amplifier(s), receives the respective supply voltage lower than a voltage required to amplify the respective RF signal(s) to a predetermined voltage. In response, the power management circuit provides a boosted voltage, which is no less than the required voltage, to the selected envelope tracking amplifier. As such, it is possible to enable the selected envelope tracking amplifier to amplify the respective RF signal(s) to the predetermined voltage without increasing cost, footprint, and power consumption of the envelope tracking power management circuit.

In one aspect, an envelope tracking power management circuit is provided. The envelope tracking power management circuit includes at least one first envelope tracking amplifier configured to amplify at least one first RF signal based on a first supply voltage received on a first supply voltage input for transmission from at least one first RF transmission circuit in at least one first RF carrier. The envelope tracking power management circuit also includes at least one second envelope tracking amplifier configured to amplify at least one second RF signal based on a second supply voltage received on a second supply voltage input for transmission from at least one second RF transmission circuit in at least one second RF carrier. The envelope tracking power management circuit also includes a power management circuit. The power management circuit is configured to determine a selected envelope tracking amplifier among the at least one first envelope tracking amplifier and the at least one second envelope tracking amplifier. The selected envelope tracking amplifier receives a respective supply voltage lower than a voltage required to amplify a respective RF signal to a predetermined voltage. The power management circuit is also configured provide a boosted voltage to a respective supply voltage input of the selected envelope tracking amplifier. The boosted voltage is greater than or equal to the voltage required to amplify the respective RF signal to the predetermined voltage.

In another aspect, an envelope tracking power management circuit is provided. The envelope tracking power management circuit includes at least one first envelope tracking amplifier configured to amplify at least one first RF signal based on a first supply voltage received on a first supply voltage input for transmission from at least one first RF transmission circuit in at least one first RF carrier. The envelope tracking power management circuit also includes at least one second envelope tracking amplifier configured to amplify at least one second RF signal based on a second supply voltage received on a second supply voltage input for transmission from at least one second RF transmission circuit in at least one second RF carrier. The envelope tracking power management circuit also includes a power management circuit. The power management circuit is configured to determine the at least one first envelope tracking amplifier receiving the first supply voltage lower than a voltage required to amplify the at least one first RF signal to a predetermined voltage. The power management circuit is also configured to provide a boosted voltage to the first supply voltage input of the at least one first envelope tracking amplifier. The boosted voltage is greater than or equal to the voltage required to amplify the at least one first RF signal to the predetermined voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Aspects disclosed in the detailed description include an envelope tracking power management circuit. An envelope tracking power management circuit includes a first envelope tracking amplifier(s) and a second envelope tracking amplifier(s), each configured to amplify a respective radio frequency (RF) signal(s) based on a respective supply voltage. A power management circuit can determine that a selected envelope tracking amplifier, which can be either the first envelope tracking amplifier(s) or the second envelope tracking amplifier(s), receives the respective supply voltage lower than a voltage required to amplify the respective RF signal(s) to a predetermined voltage. In response, the power management circuit provides a boosted voltage, which is no less than the required voltage, to the selected envelope tracking amplifier. As such, it is possible to enable the selected envelope tracking amplifier to amplify the respective RF signal(s) to the predetermined voltage without increasing cost, footprint, and power consumption of the envelope tracking power management circuit.

Figure 1:
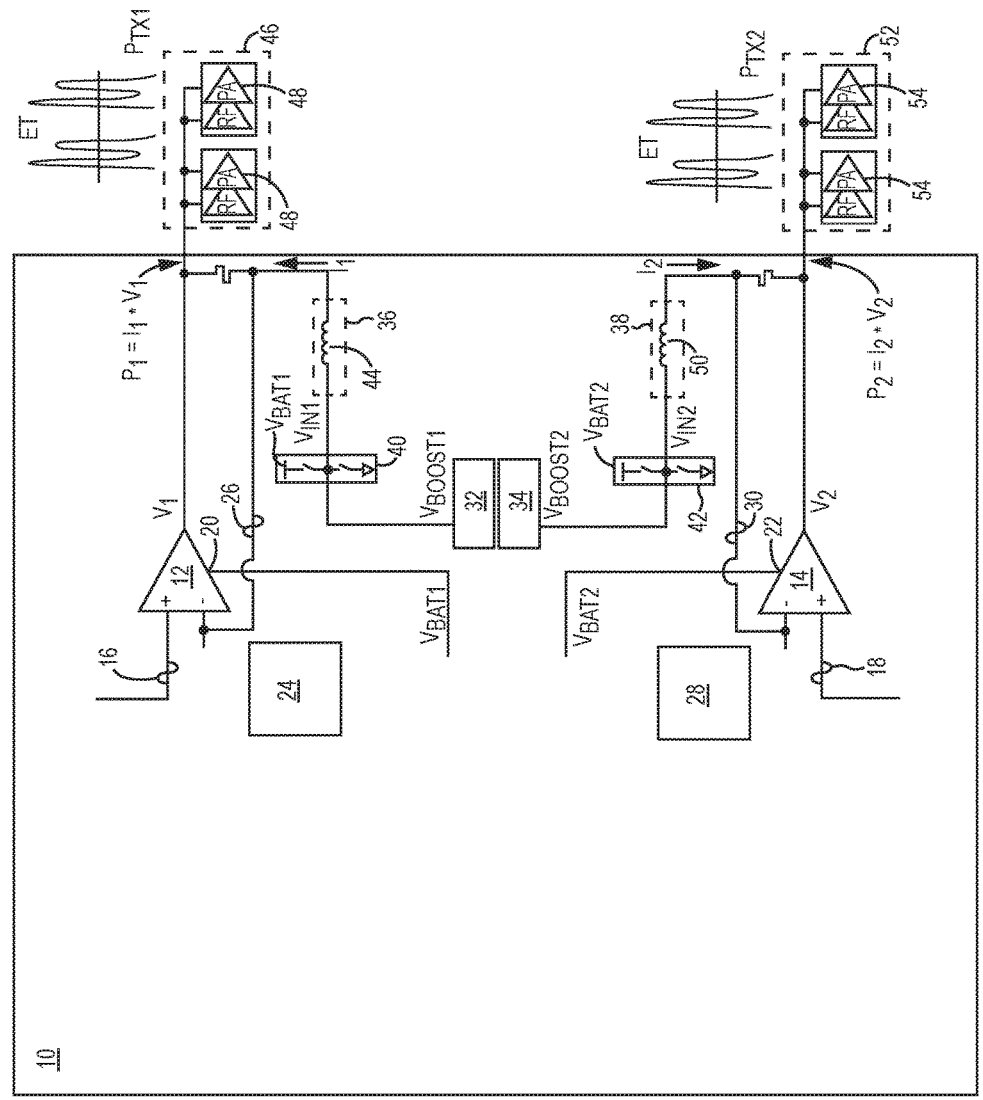
FIG. 1 is a schematic diagram of an exemplary conventional envelope tracking power management circuit in which a first envelope tracking amplifier and a second envelope tracking amplifier are configured to amplify a first radio frequency (RF) signal and a second RF signal, respectively.

Before discussing the envelope tracking power management circuit of the present disclosure, a brief discussion of a conventional envelope tracking power management circuit is first provided with reference to FIG. 1. The discussion of specific exemplary aspects of an envelope tracking power management circuit starts below with reference to FIG. 2.

In this regard, FIG. 1 is a schematic diagram of an exemplary conventional envelope tracking power management circuit 10 in which a first envelope tracking amplifier 12 and a second envelope tracking amplifier 14 are configured to amplify a first RF signal 16 and a second RF signal 18, respectively. The first envelope tracking amplifier 12 and the second envelope tracking amplifier 14 are configured to receive a first supply voltage $V_{BAT1}$ on a first supply voltage input 20 and a second supply voltage $V_{BAT2}$ on a second supply voltage input 22, respectively. In this regard, the first envelope tracking amplifier 12 amplifies the first RF signal 16 to a first voltage $V_1$ based on the first supply voltage $V_{BAT1}$. Similarly, the second envelope tracking amplifier 14 amplifies the second RF signal 18 to a second voltage $V_2$ based on the second supply voltage $V_{BAT2}$.

The first envelope tracking amplifier 12 may be controlled by a first envelope tracking controller 24 to amplify the first RF signal 16 based on a first envelope tracking feedback signal 26. Likewise, the second envelope tracking amplifier 14 can be controlled by a second envelope tracking controller 28 to amplify the second RF signal 18 based on a second envelope tracking feedback signal 30.

The conventional envelope tracking power management circuit 10 also includes first voltage boost circuitry 32, second voltage boost circuitry 34, first buck circuitry 36, and second buck circuitry 38. The first voltage boost circuitry 32 (also known as a first charge pump) is configured to generate a first boosted voltage $V_{BOOST1}$ based on the first supply voltage $V_{BAT1}$. In a non-limiting example, the first voltage boost circuitry 32 can generate the first boosted voltage $V_{BOOST1}$ that is less than or equal to two times the first supply voltage $V_{BAT1}$ ($V_{BOOST1} \leq 2*V_{BAT1}$). The second voltage boost circuitry 34 (also known as a second charge pump) is configured to generate a second boosted voltage $V_{BOOST2}$ based on the second supply voltage $V_{BAT2}$. In a non-limiting example, the second voltage boost circuitry 34 can generate the second boosted voltage $V_{BOOST2}$ that is less than or equal to two times the second supply voltage $V_{BAT2}$ ($V_{BOOST2} \leq 2*V_{BAT2}$).

The conventional envelope tracking power management circuit 10 also includes first switcher circuitry 40 and second switcher circuitry 42. The first switcher circuitry 40 is coupled to the first voltage boost circuitry 32 and the first buck circuitry 36. The first switcher circuitry 40 can be controlled (e.g., by a control circuit) to provide either the first supply voltage $V_{BAT1}$ or the first boosted voltage $V_{BOOST1}$ to the first buck circuitry 36 as a first input voltage $V_{IN1}$. The first buck circuitry 36 is configured to generate a first electrical current $I_1$ based on the first input voltage $V_{IN1}$ and respective resistance of a first inductor 44. The first buck circuitry 36 is also configured to provide the first electrical current $I_1$ to at least one first RF transmission circuit 46 for transmission in at least one first RF carrier (e.g., channel, band, etc.). Accordingly, the first RF signal 16 received by the first RF transmission circuit 46 has a first power $P_1$ that is a function of the first electrical current $I_1$ and the first voltage $V_1$ ($P_1 = I_1 * V_1$). The first RF transmission circuit 46 may include first power amplifiers 48. The first RF transmission circuit 46 is configured to distribute the first RF signal 16 in the first RF carrier at a first transmit power $P_{TX1}$ ($P_{TX1} \leq P_1$).

The second switcher circuitry 42 is coupled to the second voltage boost circuitry 34 and the second buck circuitry 38. The second switcher circuitry 42 can be controlled (e.g., by a control circuit) to provide either the second supply voltage $V_{BAT2}$ or the second boosted voltage $V_{BOOST2}$ to the second buck circuitry 38 as a second input voltage $V_{IN2}$. The second buck circuitry 38 is configured to generate a second electrical current $I_2$ based on the second input voltage $V_{IN2}$ and respective resistance of a second inductor 50. The second buck circuitry 38 is also configured to provide the second electrical current $I_2$ to at least one second RF transmission circuit 52 for transmission in at least one second RF carrier (e.g., channel, band, etc.). Accordingly, the second RF signal 18 received by the second RF transmission circuit 52 has a second power $P_2$ that is a function of the second electrical current $I_2$ and the second voltage $V_2$ ($P_2=I_2*V_2$). The second RF transmission circuit 52 may include second power amplifiers 54. The second RF transmission circuit 52 is configured to distribute the second RF signal 18 in the second RF carrier at a second transmit power $P_{TX2}$ ($P_{TX2} \leq P_2$).

The first RF carrier and the second RF carrier may be located in licensed RF spectrums. As such, a sum of the first transmit power $P_{TX1}$ and the second transmit power $P_{TX2}$ may be subject to an average power limit set by standard organizations and/or regulatory authorities. For example, if the first RF signal 16 and the second RF signal 18 are transmitted in a long-term evolution (LTE) system, the sum of the first transmit power $P_{TX1}$ and the second transmit power $P_{TX2}$ will be subject to an average power limit of 23 decibel-milliwatts (dBm).

However, under certain usage scenarios and/or operational conditions, it may be necessary to transmit one of the first RF signal 16 and the second RF signal 18 at an increased power to help improve signal-to-noise ratio (SNR) at a respective wireless receiver. For example, it can be necessary to transmit the first RF signal 16 at a peak power of 27.3 dBm in response to a need for improving the SNR. In this case, if load-lines of the first power amplifiers 48 in the first RF transmission circuit 46 are so configured to require the first voltage $V_1$ to be at 4.2 volts (V) for example, then the first supply voltage $V_{BAT1}$ of the first envelope tracking amplifier 12 would need to be approximately 4.5 V according to the equation (Eq. 1) below.

$$V_{BAT1}=V_1+P_{headroom} \quad \text{(Eq. 1)}$$

In the equation above, $P_{headroom}$ is a voltage corresponding to a peak of the first electrical current $I_1$ generated by the first buck circuitry 36, which can be approximately 0.3 V, for example. However, the conventional envelope tracking power management circuit 10 may be configured to limit the first supply voltage $V_{BAT1}$ to 3.4 V, which is the minimum supply voltage without power derating being applied. In this regard, the first envelope tracking amplifier 12 will need the first supply voltage $V_{BAT1}$ to be boosted from 3.4 V to 4.5 V to be able to generate the first voltage $V_1$ at 4.2 V. One possible solution is to add a dedicated voltage boost circuitry in the conventional envelope tracking power management circuit to boost the first supply voltage $V_{BAT1}$ from 3.4 V to 4.5 V. However, adding the dedicated voltage boost circuitry in the conventional envelope tracking power management circuit 10 can lead to increased cost, footprint, and power consumption. As such, it may be desired to boost the first supply voltage $V_{BAT1}$ without adding additional hardware in the conventional envelope tracking power management circuit 10.

As discussed above, the second voltage boost circuitry 34 can generate the second boosted voltage $V_{BOOST2} \leq 2*V_{BAT2}$, and the second buck circuitry 38 can generate the second electrical current $I_2$ based on either the second input voltage $V_{IN2}$ or the second boosted voltage $V_{BOOST2}$. Given that the sum of the first transmit power $P_{TX1}$ and the second transmit power $P_{TX2}$ are subject to the average power limit (e.g., 23 dBm in the LTE system), the second RF signal 18 would need to be transmitted at a reduced second transmit power $P_{TX2}$ when the first RF signal 16 is transmitted at an increased first transmit power $P_{TX1}$. As such, the second buck circuitry 38 can be configured to generate the second electrical current $I_2$ based on the second input voltage $V_{IN2}$.

In this regard, as further discussed in the exemplary aspects below, it is possible to configure the second switcher circuitry 42 to provide the second boosted voltage $V_{BOOST2}$ from the second voltage boost circuitry 34 to the first envelope tracking amplifier 12, thus allowing the first envelope tracking amplifier 12 to generate the first voltage $V_1$ that is required to produce the increased first transmit power $P_{TX1}$ for the first RF signal 16. Likewise, it is also possible to configure the first switcher circuitry 40 to provide the first boosted voltage $V_{BOOST1}$ from the first voltage boost circuitry 32 to the second envelope tracking amplifier 14 when the second RF signal 18 needs to be transmitted at an increased second transmit power $P_{TX2}$. By utilizing the first voltage boost circuitry 32 or the second voltage boost circuitry 34, which already exist in the conventional envelope tracking power management circuit 10, to provide the boosted voltage to the second envelope tracking amplifier 14 or the first envelope tracking amplifier 12, it is possible to eliminate the need for dedicated power boost circuitries, thus helping to reduce cost, footprint, and power consumption in an envelope tracking power management circuit.

Figure 2:
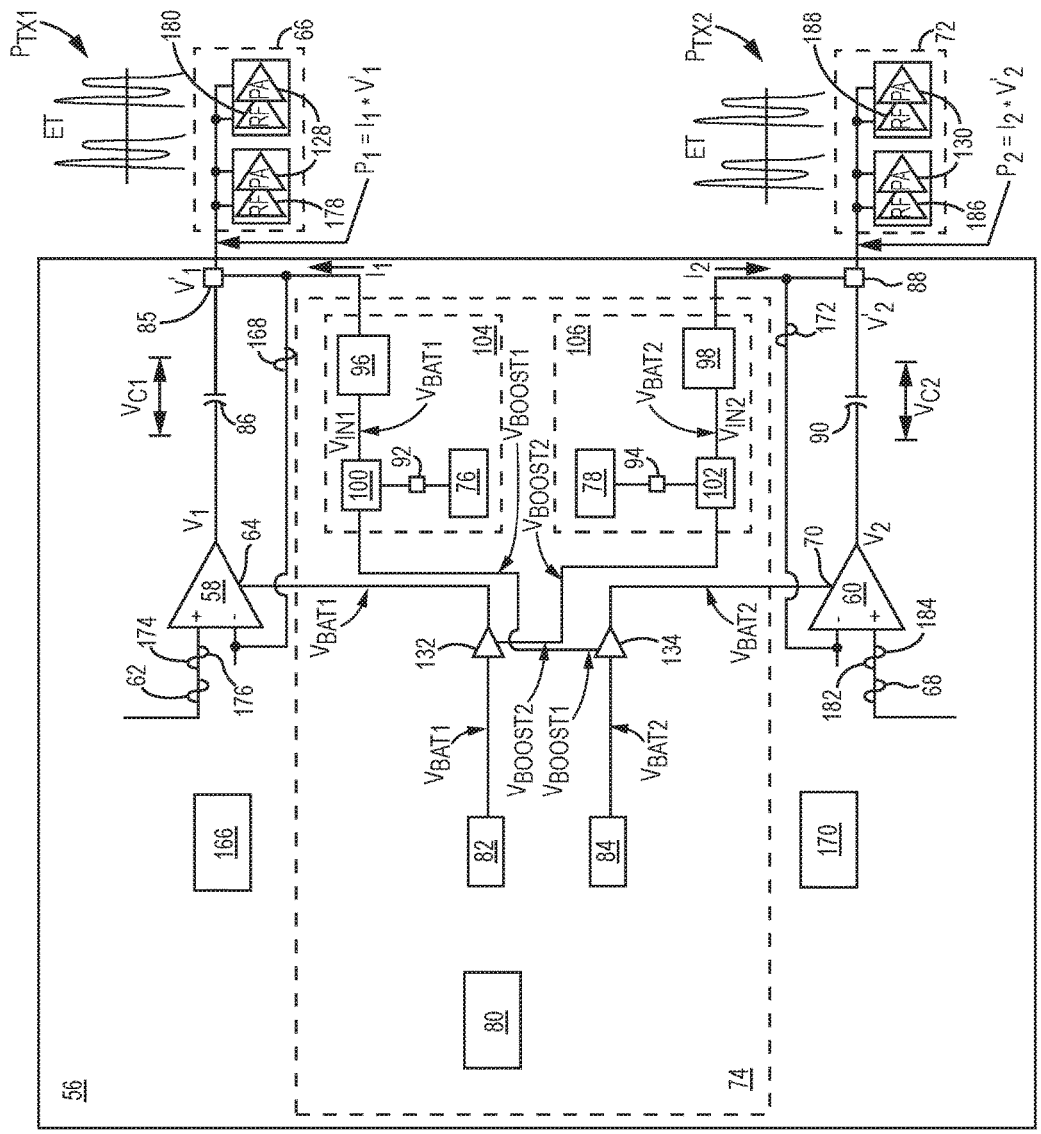
FIG. 2 is a schematic diagram of an exemplary envelope tracking power management circuit in which a selected envelope tracking amplifier among at least one first envelope tracking amplifier and at least one second envelope tracking amplifier can be configured to receive a boosted voltage without requiring dedicated voltage boost circuitry.

In this regard, FIG. 2 is a schematic diagram of an exemplary envelope tracking power management circuit 56 in which a selected envelope tracking amplifier among at least one first envelope tracking amplifier 58 and at least one second envelope tracking amplifier 60 can be configured to receive a boosted voltage without requiring dedicated voltage boost circuitry. The first envelope tracking amplifier 58 is configured to amplify at least one first RF signal 62 based on a first supply voltage $V_{BAT1}$ received on a first supply voltage input 64 for transmission from at least one first RF transmission circuit 66 in at least one first RF carrier. The second envelope tracking amplifier 60 is configured to amplify at least one second RF signal 68 based on a second supply voltage $V_{BAT2}$ received on a second supply voltage input 70 for transmission from at least one second RF transmission circuit 72 in at least one second RF carrier.

The envelope tracking power management circuit 56 includes a power management circuit 74. The power management circuit 74 includes first voltage boost circuitry 76 (also known as a first charge pump) configured to generate a first boosted voltage $V_{BOOST1}$ and second voltage boost circuitry 78 (also known as a second charge pump) configured to generate a second boosted voltage $V_{BOOST2}$. The power management circuit 74 includes at least one control circuit 80, which can be a microprocessor, a microcontroller, a digital signal processor (DSP), and a field programmable gate array (FPGA), for example. The control circuit 80 is configured to determine that the selected envelope tracking amplifier receives a respective supply voltage that is lower than a voltage required to amplify a respective RF signal to a predetermined voltage. In response, the control circuit 80 provides a boosted voltage among the first boosted voltage $V_{BOOST1}$ and the second boosted voltage $V_{BOOST2}$ to a respective supply voltage input of the selected envelope tracking amplifier. The boosted voltage is configured to be greater than or equal to the voltage required to amplify the respective RF signal to the predetermined voltage.

In one non-limiting example, the control circuit 80 may determine that the first supply voltage $V_{BAT1}$ received by the first envelope tracking amplifier 58 is lower than the voltage required to amplify the first RF signal 62 to the predetermined voltage. As such, the control circuit 80 is configured to provide the second boosted voltage $V_{BOOST2}$ to the first supply voltage input 64 of the first envelope tracking amplifier 58 to amplify the first RF signal 62 to the predetermined voltage. In another non-limiting example, the control circuit 80 may determine that the second supply voltage $V_{BAT2}$ received by the second envelope tracking amplifier 60 is lower than the voltage required to amplify the second RF signal 68 to the predetermined voltage. As such, the control circuit 80 is configured to provide the first boosted voltage $V_{BOOST1}$ to the second supply voltage input 70 of the second envelope tracking amplifier 60 to amplify the second RF signal 68 to the predetermined voltage.

As further discussed below, both the first voltage boost circuitry 76 and the second voltage boost circuitry 78 are provided in the power management circuit 74 to provide predefined functionalities, as opposed to being dedicated to providing the boosted voltage to the selected envelope tracking amplifier. In other words, the first voltage boost circuitry 76 and the second voltage boost circuitry 78 are existing elements in the power management circuit 74 that are reconfigured to provide the boosted voltage to the selected envelope tracking amplifier while continuing to provide the predefined functionalities. By reconfiguring the first voltage boost circuitry 76 or the second voltage boost circuitry 78 to provide the boosted voltage to the selected envelope tracking amplifier, it is possible to reduce cost, footprint, and power consumption in the envelope tracking power management circuit 56.

The first envelope tracking amplifier 58 is configured to amplify the first RF signal 62 to a first voltage $V_1$ based on the first supply voltage $V_{BAT1}$ received on the first supply voltage input 64. The second envelope tracking amplifier 60 is configured to amplify the second RF signal 68 to a second voltage $V_2$ based on the second supply voltage $V_{BAT2}$ received on the second supply voltage input 70. In a non-limiting example, the first supply voltage $V_{BAT1}$ and the second supply voltage $V_{BAT2}$ are received from a first direct current (DC) source 82 and a second DC source 84, respectively. In another non-limiting example, the first supply voltage $V_{BAT1}$ and the second supply voltage $V_{BAT2}$ both equal 3.4 V.

The first envelope tracking amplifier 58 is coupled to the first RF transmission circuit 66 via a first coupling point 85. The first envelope tracking amplifier 58 may be coupled to the first coupling point 85 via a first offset capacitor 86 configured to provide a first offset voltage $V_{C1}$. The first offset voltage $V_{C1}$, which can be 1 V for example, can help to raise the first voltage $V_1$ to a modified first voltage $V'_1$ ($V'_1=V_1+V_{C1}$) at the first coupling point 85, thus helping to lower the first supply voltage $V_{BAT1}$ required by the first envelope tracking amplifier 58 to improve power efficiency in the power management circuit 74. For example, if the first envelope tracking amplifier 58 is coupled directly to the first coupling point 85 without the first offset capacitor 86, then the modified first voltage $V'_1$ will be the same as the first voltage $V_1$. In this regard, if the modified first voltage $V'_1$ at the first coupling point 85 is required to be 5 V for example, the first voltage $V_1$ produced by the first envelope tracking amplifier 58 will also be 5 V. Accordingly, the first supply voltage $V_{BAT1}$ needs to be at least 5 V. In contrast, if the first envelope tracking amplifier 58 is coupled to the first coupling point 85 via the first offset capacitor 86 that provides the 1 V first offset voltage $V_{C1}$, then the first envelope tracking amplifier 58 would only need to produce the first voltage $V_1$ at 4 V. As a result, the first supply voltage $V_{BAT1}$ can be reduced to 4 V as well, thus helping to improve power efficiency in the power management circuit 74.

Similarly, the second envelope tracking amplifier 60 is coupled to the second RF transmission circuit 72 via a second coupling point 88. The second envelope tracking amplifier 60 may be coupled to the second coupling point 88 via a second offset capacitor 90 configured to provide a second offset voltage $V_{C2}$. The second offset voltage $V_{C2}$, which can be 1 V for example, can help to raise the second voltage $V_2$ to a modified second voltage $V'_2$ ($V'_2=V_2+V_{C2}$) at the second coupling point 88.

The first voltage boost circuitry 76 is configured to generate the first boosted voltage $V_{BOOST1}$ that is less than or equal to two times the first supply voltage $V_{BAT1}$ ($V_{BOOST1} \leq 2*V_{BAT1}$). The first voltage boost circuitry 76 is configured to provide the first boosted voltage $V_{BOOST1}$ to a first boosted voltage output 92. The second voltage boost circuitry 78 is configured to generate the second boosted voltage $V_{BOOST2}$ that is less than or equal to two times the second supply voltage $V_{BAT2}$ ($V_{BOOST2} \leq 2*V_{BAT2}$). The second voltage boost circuitry 78 is configured to provide the second boosted voltage $V_{BOOST2}$ to a second boosted voltage output 94.

The power management circuit 74 also includes first buck circuitry 96, second buck circuitry 98, first switcher circuitry 100, and second switcher circuitry 102. Collectively, the first voltage boost circuitry 76, the first buck circuitry 96, and the first switcher circuitry 100 are hereinafter referred to as a first voltage distribution circuit 104. Similarly, the second voltage boost circuitry 78, the second buck circuitry 98, and the second switcher circuitry 102 are hereinafter referred to as a second voltage distribution circuit 106.

The first switcher circuitry 100 is coupled to the first voltage boost circuitry 76 and the first buck circuitry 96. The second switcher circuitry 102 is coupled to the second voltage boost circuitry 78 and the second buck circuitry 98. The control circuit 80 is configured to be communicatively coupled to the first switcher circuitry 100 and the second switcher circuitry 102. In this regard, when the control circuit 80 determines that the second envelope tracking amplifier 60 is the selected envelope tracking amplifier in need of the boosted voltage, the control circuit 80 can control the first switcher circuitry 100 to provide the first boosted voltage $V_{BOOST1}$ to the second envelope tracking amplifier 60. Likewise, when the control circuit 80 determines that the first envelope tracking amplifier 58 is the selected envelope tracking amplifier in need of the boosted voltage, the control circuit 80 can control the second switcher circuitry 102 to provide the second boosted voltage $V_{BOOST2}$ to the first envelope tracking amplifier 58. In addition, the control circuit 80 can control the first switcher circuitry 100 to provide the first supply voltage $V_{BAT1}$ to the first buck circuitry 96 as a first input voltage $V_{IN1}$. Likewise, the control circuit 80 can also control the second switcher circuitry 102 to provide the second supply voltage $V_{BAT2}$ to the second buck circuitry 98 as a second input voltage $V_{IN2}$.

Figure 3:
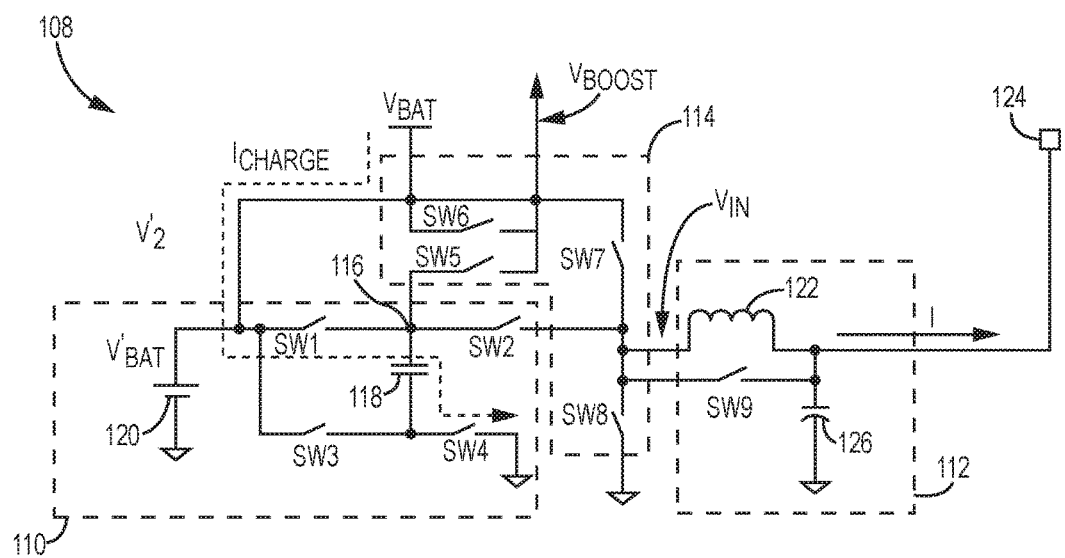
FIG. 3 is a schematic diagram of an exemplary voltage distribution circuit that can be provided in the envelope tracking power management circuit of FIG. 2.

To help understand how the first switcher circuitry 100 and the second switcher circuitry 102 can be controlled to distribute the boosted voltage, FIG. 3 is discussed next. In this regard, FIG. 3 is a schematic diagram of an exemplary voltage distribution circuit 108 that can be provided in the envelope tracking power management circuit 56 of FIG. 2 as the first voltage distribution circuit 104 and the second voltage distribution circuit 106. Common elements between FIGS. 2 and 3 are shown therein with common element numbers and will not be re-described herein.

With reference to FIG. 3, the voltage distribution circuit 108 includes voltage boost circuitry 110 that is functionally equivalent to the first voltage boost circuitry 76 and the second voltage boost circuitry 78 of FIG. 2. The voltage distribution circuit 108 includes buck circuitry 112 that is functionally equivalent to the first buck circuitry 96 and the second buck circuitry 98 of FIG. 2. The voltage distribution circuit 108 includes switcher circuitry 114 that is functionally equivalent to the first switcher circuitry 100 and the second switcher circuitry 102 of FIG. 2. As such, the voltage distribution circuit 108 can be provided in the envelope tracking power management circuit 56 as the first voltage distribution circuit 104 and/or the second voltage distribution circuit 106.

The voltage boost circuitry 110 includes switches SW1, SW2, SW3, and SW4. The switcher circuitry 114 includes switches SW5, SW6, SW7, and SW8. The voltage boost circuitry 110 can be configured to generate a boosted voltage $V_{BOOST}$, which can be either the first boosted voltage $V_{BOOST1}$ or the second boosted voltage $V_{BOOST2}$ of FIG. 2, and provide the boosted voltage $V_{BOOST}$ to a boosted voltage output 116, which can be either the first boosted voltage output 92 or the second boosted voltage output 94 of FIG. 2. The voltage boost circuitry 110 is first controlled to charge a capacitor 118 to a supply voltage $V_{BAT}$, which can be either the first supply voltage $V_{BAT1}$ or the second supply voltage $V_{BAT2}$ of FIG. 2, for example. To do so, the voltage boost circuitry 110 is controlled to close the switches SW1 and SW4, while keeping the rest of the switches open. Accordingly, a charging current $I_{CHARGE}$ can be induced to charge the capacitor 118 to the supply voltage $V_{BAT}$.

To generate the boosted voltage $V_{BOOST}$ at the boosted voltage output 116, the switcher circuitry 114 is controlled to close the switch SW3, while keeping the rest of the switches open. As such, the boosted voltage $V_{BOOST}$ at the boosted voltage output 116 will equal a sum of the voltage of the capacitor 118, which has been charged to the supply voltage $V_{BAT}$, and a voltage $V'_{BAT}$ drawn from a battery 120 ($V_{BOOST}=V_{BAT}+V'_{BAT}$). If the voltage $V'_{BAT}$ is less than or equal to the supply voltage $V_{BAT}$, the boosted voltage $V_{BOOST}$ will be less than or equal to two times the supply voltage $V_{BAT}$ ($V_{BOOST} \leq 2*V_{BAT}$). In this regard, when the voltage boost circuitry 110 is provided in the power management circuit 74 as the first voltage boost circuitry 76 and the second voltage boost circuitry 78, the first voltage boost circuitry 76 can generate the first boosted voltage $V_{BOOST1}$ as being greater than or equal to the first supply voltage $V_{BAT1}$, and the second voltage boost circuitry 78 can generate the second boosted voltage $V_{BOOST2}$ as being greater than or equal to the second supply voltage $V_{BAT2}$. The switcher circuitry 114 is further controlled to close the switch SW5 to output the boosted voltage $V_{BOOST}$ from the boosted voltage output 116.

The buck circuitry 112 includes an inductor 122. The buck circuitry 112 is configured to generate an electrical current I based on an input voltage $V_{IN}$, which is equivalent to the first input voltage $V_{IN1}$ or the second input voltage $V_{IN2}$ of FIG. 2. In one non-limiting example, the switcher circuitry 114 can be controlled to close the switch SW7 to provide the supply voltage $V_{BAT}$ to the buck circuitry 112 as the input voltage $V_{IN}$, while keeping the switches SW3 and SW5 closed to output the boosted voltage $V_{BOOST}$ from the boosted voltage output 116. In another non-limiting example, the switcher circuitry 114 can be controlled to close the switches SW2 and SW3 to provide the boosted voltage $V_{BOOST}$ to the buck circuitry 112 as the input voltage $V_{IN}$, while keeping the switch SW5 closed to output the boosted voltage $V_{BOOST}$ from the boosted voltage output 116. In this regard, the electrical current I can vary as a function of the input voltage $V_{IN}$. The electrical current I may be maximized when the input voltage $V_{IN}$ is the boosted voltage $V_{BOOST}$.

The buck circuitry 112 can be controlled to output the electrical current I to a coupling point 124, which is equivalent to the first coupling point 85 and the second coupling point 88 of FIG. 2. The buck circuitry 112 may include a bypass switch SW9 and a bypass capacitor 126. The buck circuitry 112 can be controlled to close the bypass switch SW9 to prevent the electrical current I from being provided to the coupling point 124. In this regard, when the buck circuitry 112 is configured to function as the first buck circuitry 96 of FIG. 2, the buck circuitry 112 generates the first electrical current $I_1$ based on the first input voltage $V_{IN1}$ and provides the first electrical current $I_1$ to the first RF transmission circuit 66. Likewise, when the buck circuitry 112 is configured to function as the second buck circuitry 98 of FIG. 2, the buck circuitry 112 generates the second electrical current $I_2$ based on the second input voltage $V_{IN2}$ and provides the second electrical current $I_2$ to the second RF transmission circuit 72.

With reference back to FIG. 2, the first RF signal 62 received by the first RF transmission circuit 66 has a first power $P_1$ that is a function of the first electrical current $I_1$ and the modified first voltage $V'_1$ ($P_1=I_1*V'_1$). The first RF transmission circuit 66 may include at least one first power amplifier 128 configured to cause the first RF signal 62 to be transmitted at a first transmit power $P_{TX1}$ ($P_{TX1} \leq P_1$) in the first RF carrier. Likewise, the second RF signal 68 received by the second RF transmission circuit 72 has a second power $P_2$ that is a function of the second electrical current $I_2$ and the modified second voltage $V'_2$ ($P_2=I_2*V'_2$). The second RF transmission circuit 72 may include at least one second power amplifier 130 configured to cause the second RF signal 68 to be transmitted at a second transmit power $P_{TX2}$ ($P_{TX2} \leq P_2$) in the second RF carrier.

The first RF carrier and the second RF carrier may be located in licensed RF spectrums. As such, an average total power $P_{TOTAL}$ of the first transmit power $P_{TX1}$ and the second transmit power $P_{TX2}$ may be subject to an average power limit determined by standard organizations and/or regulatory authorities. For example, if the first RF signal 62 and the second RF signal 68 are transmitted in the LTE system, the average total power $P_{TOTAL}$ will need to stay below an average total power limit of 23 dBm.

In compliance with the 23 dBm average total power limit, exemplary relationships between the first transmit power $P_{TX1}$, the second transmit power $P_{TX2}$, and the average total power $P_{TOTAL}$ are provided in Table 1 below. The exemplary relationships in Table 1 referenced hereinafter help demonstrate the rationale behind reconfiguring the first voltage boost circuitry 76 or the second voltage boost circuitry 78 to provide the boosted voltage to the selected envelope tracking amplifier.

TABLE 1

| $P_{TX1}$ (dBm) | $P_{TX2}$ (dBm) | $P_{TOTAL}$ (dBm) | BK1 (dB) | BK2 (dB) |
|---|---|---|---|---|
| 23 | −10 | 23 | 0 | 33 |
| 22.2 | 15 | 23 | 0.8 | 8 |
| −10 | 23 | 23 | 33 | 0 |

According to Table 1, when the first transmit power $P_{TX1}$ is at 23 dBm, the second transmit power $P_{TX2}$ needs to be around −10 dBm to satisfy the 23 dBm average total power limit. As such, the first power amplifier 128 has a first power back-off BK1 of 0 dB, and the second power amplifier 130 has a second power back-off BK2 of 33 dB. When the first transmit power $P_{TX1}$ is at 22.2 dBm, the second transmit power $P_{TX2}$ needs to be at 15 dBm or below to satisfy the 23 dBm average total power limit. Accordingly, the first power amplifier 128 has a first power back-off BK1 of 0.8 dB, and the second power amplifier 130 has a second power back-off BK2 of 8 dB. When the second transmit power $P_{TX2}$ is at 23 dBm, the first transmit power $P_{TX1}$ needs to be around −10 dBm to satisfy the 23 dBm average total power limit. As such, the first power amplifier 128 has a first power back-off BK1 of 33 dB, and the second power amplifier 130 has a second power back-off BK2 of 0 dB.

The first power amplifier 128 may have a first load-line voltage $V_{L1}$ and a first threshold voltage $V_{knee1}$. In this regard, the modified first voltage $V'_1$ required to cause the first power amplifier 128 to amplify the first RF signal 62 to the first transmit power $P_{TX1}$ in Table 1 can be determined based on the equation (Eq. 2) below.

$$V'_1 = 10^{-\left(\frac{BK1}{20}\right)} * (V_{L1} - V_{knee1}) + V_{knee1} \qquad (\text{Eq. 2})$$

In a non-limiting example, the first load-line voltage $V_{L1}$ and the first threshold voltage $V_{knee1}$ can be 4.2 V and 0.5 V, respectively. Accordingly, the equation (Eq. 2) can be simplified as follows.

$$V'_1 = \left(10^{-\left(\frac{BK1}{20}\right)}\right) * 3.7 + 0.5 \qquad (\text{Eq. 2.1})$$

Accordingly, the first voltage $V_1$ generated by the first envelope tracking amplifier 58 can be determined by the equation (Eq. 3) below.

$$V_1 = V'_1 - V_{C1} + P_{Headroom1} \qquad (\text{Eq. 3})$$

In the equation (Eq. 3) above, $V_{C1}$ is the first offset voltage produced by the first offset capacitor 86, and $P_{Headroom1}$ is a voltage corresponding to a peak of the first electrical current $I_1$ generated by the first buck circuitry 96. In a non-limiting example, the first offset voltage $V_{C1}$ and the voltage $P_{Headroom1}$ can be 0.8V and 0.3V, respectively. Accordingly, the equation (Eq. 3) can be simplified as follows.

$$V_1 = V'_1 - 0.5 \qquad (\text{Eq. 3.1})$$

Likewise, the second power amplifier 130 may have a second load-line voltage $V_{L2}$ and a second threshold voltage $V_{knee2}$. In this regard, the modified second voltage $V'_2$ required to cause the second power amplifier 130 to amplify the second RF signal 68 to the second transmit power $P_{TX2}$ in Table 1 can be computed based on the equation (Eq. 4) below.

$$V'_2 = 10^{-\left(\frac{BK2}{20}\right)} * (V_{L2} - V_{knee2}) + V_{knee2} \qquad (\text{Eq. 4})$$

In a non-limiting example, the second load-line voltage $V_{L2}$ and the second threshold voltage $V_{knee2}$ can be 4.2 V and 0.5 V, respectively. Accordingly, the equation (Eq. 4) can be simplified as follows.

$$V'_2 = \left(10^{-\left(\frac{BK2}{20}\right)}\right) * 3.7 + 0.5 \qquad (\text{Eq. 4.1})$$

Accordingly, the second voltage $V_2$ generated by the second envelope tracking amplifier 60 can be determined by the equation (Eq. 5) below.

$$V_2 = V'_2 - V_{C2} + P_{Headroom2} \qquad (\text{Eq. 5})$$

In the equation (Eq. 5) above, $V_{C2}$ is the second offset voltage produced by the second offset capacitor 90, and $P_{Headroom2}$ is a voltage corresponding to a peak of the second electrical current $I_2$ generated by the second buck circuitry 98. In a non-limiting example, the second offset voltage $V_{C2}$ and the voltage $P_{Headroom2}$ can be 0.8V and 0.3V, respectively. Accordingly, the equation (Eq. 5) can be simplified as follows.

$$V_2 = V'_2 - 0.5 \qquad (\text{Eq. 5.1})$$

Table 2 illustrates relationships between the first voltage $V_1$, the second voltage $V_2$, the first transmit power $P_{TX1}$, and the second transmit power $P_{TX2}$ as determined based on equations Eq. 2.1, Eq. 3.1, Eq. 4.1, and Eq. 5.1.

TABLE 2

| $P_{TX1}$ (dBm) | $P_{TX2}$ (dBm) | BK1 (dB) | BK2 (dB) | $V'_1$ (V) | $V'_2$ (V) | $V_1$ (V) | $V_2$ (V) |
|---|---|---|---|---|---|---|---|
| 23 | −10 | 0 | 33 | 4.2 | 0.58 | 3.7 | 0.08 |
| 22.2 | 15 | 0.8 | 8 | 3.87 | 1.97 | 3.37 | 1.47 |
| −10 | 23 | 33 | 0 | 0.58 | 4.2 | 0.08 | 3.7 |

According to Table 2, when the first RF signal 62 is transmitted at the first transmit power $P_{TX1}$ of 23 dBm, the first envelope tracking amplifier 58 needs to amplify the first RF signal 62 to the first voltage $V_1$ of 3.7 V. Accordingly, the first supply voltage $V_{BAT1}$ also needs to be at least 3.7 V. As previously discussed, the first supply voltage $V_{BAT1}$ may be only 3.4 V. In this regard, the first supply voltage $V_{BAT1}$ will be lower than the voltage (e.g., 3.7 V) required for amplifying the first RF signal 62 to the predetermined voltage. However, given that the second RF signal 68 is required to be transmitted at the second transmit power $P_{TX2}$ of −10 dBm, the second envelope tracking amplifier 60 only needs to amplify the second RF signal 68 to the second voltage $V_2$ of 0.08 V. In this regard, the second supply voltage $V_{BAT2}$, which is at 3.4 V as previously discussed, will be higher than the voltage (0.08 V) required for amplifying the second RF signal 68 to the predetermined voltage. Therefore, the control circuit 80 can control the second switcher circuitry 102 and the second voltage boost circuitry 78 to provide the second boosted voltage $V_{BOOST2}$ to the first envelope tracking amplifier 58. As a result, the first envelope tracking amplifier 58 would be able to amplify the first RF signal 62 to the first voltage $V_1$ of 3.7 V and consequently cause the first RF signal 62 to be transmitted at the first transmit power $P_{TX1}$ of 23 dBm.

When the first RF signal 62 is transmitted at the first transmit power $P_{TX1}$ of 22.2 dBm, the first envelope tracking amplifier 58 needs to amplify the first RF signal 62 to the first voltage $V_1$ of 3.37 V. Accordingly, the first supply voltage $V_{BAT1}$ also needs to be at least 3.37 V. In this regard, the first supply voltage $V_{BAT1}$, which is 3.4 V, is higher than the voltage (3.37 V) required for amplifying the first RF signal 62 to the predetermined voltage. As such, the first envelope tracking amplifier 58 does not require the boosted voltage. The second RF signal 68, on the other hand, is transmitted at the second transmit power $P_{TX2}$ of 15 dBm. Accordingly, the second envelope tracking amplifier 60 only needs to amplify the second RF signal 68 to the second voltage $V_2$ of 1.47 V, which is lower than the second supply voltage $V_{BAT2}$ (3.4 V). Therefore, the second envelope tracking amplifier 60 also does not require the boosted voltage.

Based on the analysis presented above, it can be concluded that, at any given time, no more than one of the first envelope tracking amplifier 58 and the second envelope tracking amplifier 60 would require the boosted voltage. In this regard, in response to determining that the first envelope tracking amplifier 58 receives the first supply voltage $V_{BAT1}$ that is lower than the voltage required to amplify the first RF signal 62 to the predetermined voltage, the control circuit 80 can couple the second boosted voltage output 94 of the second voltage boost circuitry 78 to the first supply voltage input 64 to provide the second boosted voltage $V_{BOOST2}$ to the first envelope tracking amplifier 58. Likewise, in response to determining that the second envelope tracking amplifier 60 receives the second supply voltage $V_{BAT2}$ that is lower than the voltage required to amplify the second RF signal 68 to the predetermined voltage, the control circuit 80 can couple the first boosted voltage output 92 of the first voltage boost circuitry 76 to the second supply voltage input 70 to provide the first boosted voltage $V_{BOOST1}$ to the second envelope tracking amplifier 60.

With continuing reference to FIG. 2, the power management circuit 74 may include first low drop-off output (LDO) circuitry 132 coupled to the first supply voltage input 64 of the first envelope tracking amplifier 58. In this regard, the control circuit 80 is configured to couple the second boosted voltage output 94 of the second voltage boost circuitry 78 to the first LDO circuitry 132 to provide the second boosted voltage $V_{BOOST2}$ to the first envelope tracking amplifier 58. The power management circuit 74 may include second LDO circuitry 134 coupled to the second supply voltage input 70 of the second envelope tracking amplifier 60. In this regard, the control circuit 80 is configured to couple the first boosted voltage output 92 of the first voltage boost circuitry 76 to the second LDO circuitry 134 to provide the first boosted voltage $V_{BOOST1}$ to the second envelope tracking amplifier 60.

Figure 4:
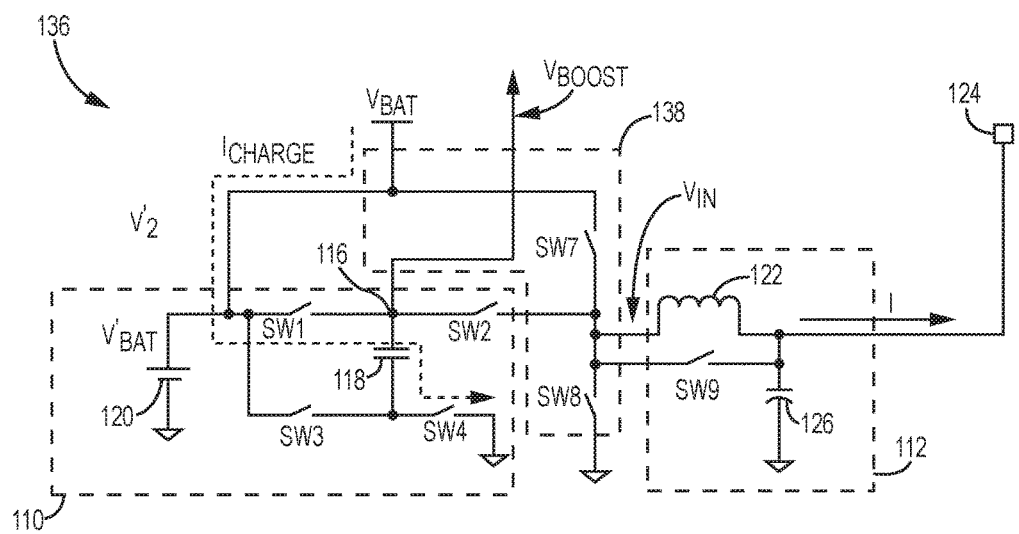
FIG. 4 is a schematic diagram of an exemplary simplified voltage distribution circuit that can be provided in the envelope tracking power management circuit of FIG. 2.

By providing the first boosted voltage $V_{BOOST1}$ and the second boosted voltage $V_{BOOST2}$ through the second LDO circuitry 134 and the first LDO circuitry 132, respectively, it is possible to simplify the switcher circuitry 114 of FIG. 3. In this regard, FIG. 4 is a schematic diagram of an exemplary simplified voltage distribution circuit 136 that can be provided in the envelope tracking power management circuit 56 of FIG. 2 as the first voltage distribution circuit 104 and the second voltage distribution circuit 106. Common elements between FIGS. 2-4 are shown therein with common element numbers and will not be re-described herein.

The simplified voltage distribution circuit 136 includes switcher circuitry 138 that can be provided in the power management circuit 74 of FIG. 2 as the first switcher circuitry 100 and/or the second switcher circuitry 102. The switcher circuitry 138 is simplified from the switcher circuitry 114 of FIG. 3 by eliminating the switches SW5 and SW6. In the regard, the boosted voltage output 116, which can be either the first boosted voltage output 92 or the second boosted voltage output 94, is always outputting the boosted voltage $V_{BOOST}$.

Figure 5:
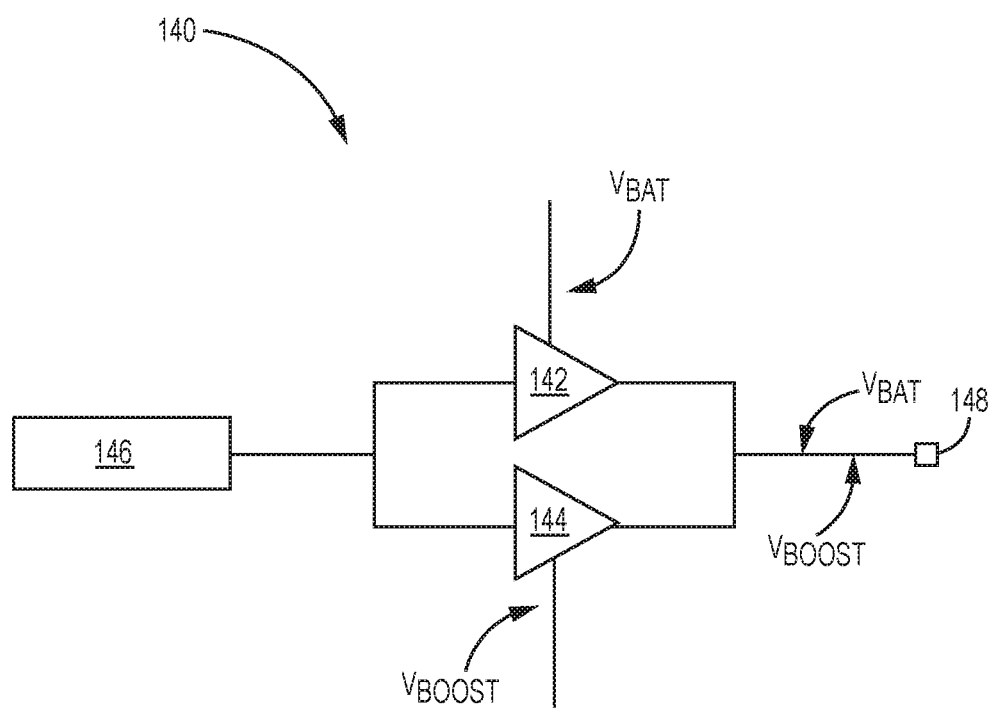
FIG. 5 is a schematic diagram of an exemplary low drop-off output (LDO) circuit including LDO circuitry configured to receive a supply voltage and boosted LDO circuitry configured to receive a boosted voltage higher than the supply voltage.

With reference back to FIG. 2, the first LDO circuitry 132 and the second LDO circuitry 134 can be collocated with additional LDO circuitries dedicated for supplying the boosted voltage to the first envelope tracking amplifier 58 and the second envelope tracking amplifier 60. In this regard, FIG. 5 is a schematic diagram of an exemplary LDO circuit 140 including LDO circuitry 142 configured to receive a supply voltage $V_{BAT}$, and boosted LDO circuitry 144 configured to receive a boosted voltage $V_{BOOST}$ higher than the supply voltage $V_{BAT}$.

The LDO circuitry 142 is functionally equivalent to the first LDO circuitry 132 and the second LDO circuitry 134 of FIG. 2. In this regard, the LDO circuitry 142 can be provided as the first LDO circuitry 132 in the power management circuit 74 of FIG. 2 to provide the first supply voltage $V_{BAT1}$ to the first supply voltage input 64. Likewise, the LDO circuitry 142 can be provided as the second LDO circuitry 134 in the power management circuit 74 of FIG. 2 to provide the second supply voltage $V_{BAT2}$ to the second supply voltage input 70. The LDO circuitry 142 and the boosted LDO circuitry 144 are both coupled to a DC source 146, which can be either the first DC source 82 or the second DC source 84 of FIG. 2. The boosted LDO circuitry 144 is configured to receive the boosted voltage $V_{BOOST}$, which can be the first boosted voltage $V_{BOOST1}$ or the second boosted voltage $V_{BOOST2}$ of FIG. 2. The LDO circuit 140 is configured to output either the supply voltage $V_{BAT}$ or the boosted voltage $V_{BOOST}$ to a supply voltage input 148, which can be the first supply voltage input 64 or the second supply voltage input 70 of FIG. 2.

As previously discussed in FIG. 2, the first voltage boost circuitry 76 can generate the first boosted voltage $V_{BOOST1}$ that is between the first supply voltage $V_{BAT1}$ and two times the first supply voltage $V_{BAT1}$ ($V_{BAT1} \leq V_{BOOST1} \leq 2*V_{BAT1}$), and the second voltage boost circuitry 78 can generate the second boosted voltage $V_{BOOST2}$ that is between the second supply voltage $V_{BAT2}$ and two times the second supply voltage $V_{BAT2}$ ($V_{BAT2} \leq V_{BOOST2} \leq 2*V_{BAT2}$). If the first supply voltage $V_{BAT1}$ and the second supply voltage $V_{BAT2}$ are both 3.4 V, for example, the first boosted voltage $V_{BOOST1}$ and the second boosted voltage $V_{BOOST2}$ can both be up to 6.8 V. As a result, the first boosted voltage $V_{BOOST1}$ and/or the second boosted voltage $V_{BOOST2}$ may be too high for the second envelope tracking amplifier 60 and/or the first envelope tracking amplifier 58 to tolerate. As such, it may be desired to regulate the first boosted voltage $V_{BOOST1}$ and/or the second boosted voltage $V_{BOOST2}$. In this regard, FIG. 6 is a schematic diagram of an exemplary voltage regulating circuit 150 configured to regulate the first boosted voltage $V_{BOOST1}$ and the second boosted voltage $V_{BOOST2}$ of FIG. 2.

Figure 6:
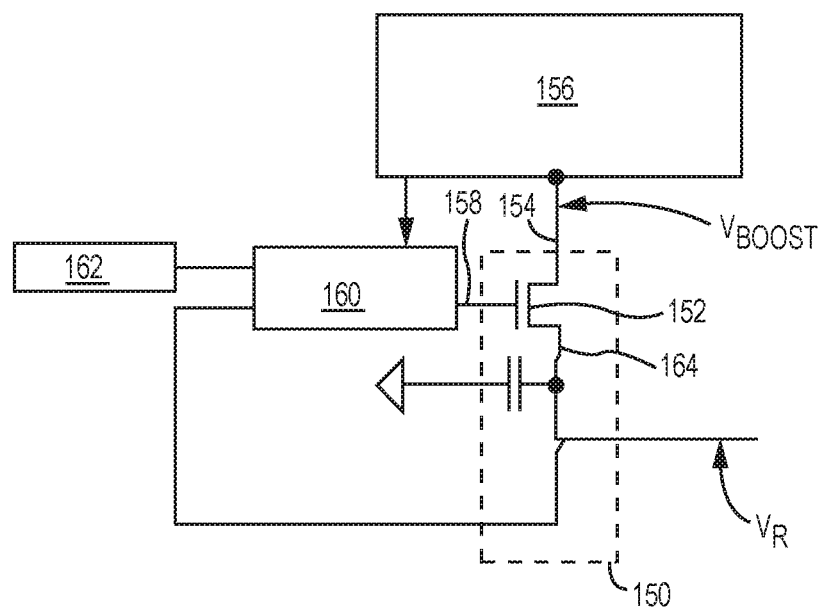
FIG. 6 is a schematic diagram of an exemplary voltage regulating circuit configured to regulate a first boosted voltage and a second boosted voltage of FIG. 2.

With reference to FIG. 6, the voltage regulating circuit 150 includes a p-type metal-oxide semiconductor field-effect transistor (pMOSFET) 152 having a drain electrode 154 coupled to voltage boost circuitry 156. The voltage boost circuitry 156 can be the first voltage boost circuitry 76 or the second voltage boost circuitry 78 of FIG. 2. In this regard, the pMOSFET 152 can be provided in the power management circuit 74 of FIG. 2 to regulate the first boosted voltage $V_{BOOST1}$ generated by the first voltage boost circuitry 76 and/or the second boosted voltage $V_{BOOST2}$ generated by the second voltage boost circuitry 78.

The pMOSFET 152 receives a boosted voltage $V_{BOOST}$, which can be either the first boosted voltage $V_{BOOST1}$ or the second boosted voltage $V_{BOOST2}$, from the voltage boost circuitry 156. The pMOSFET 152 has a gate electrode 158 coupled to an LDO controller 160. The LDO controller 160 is coupled to a DC source 162, which can be either the first DC source 82 or the second DC source 84 of FIG. 2. The LDO controller 160 is configured to adjust a voltage applied to the gate electrode 158, thus regulating the boosted voltage $V_{BOOST}$ received on the drain electrode 154 to produce a regulated boosted voltage $V_R$. The pMOSFET 152 has a source electrode 164 configured to output the regulated boosted voltage $V_R$. In this regard, when the pMOSFET 152 is coupled to the first voltage boost circuitry 76, the pMOSFET 152 regulates the first boosted voltage $V_{BOOST1}$. Likewise, when the pMOSFET 152 is coupled to the second voltage boost circuitry 78, the pMOSFET 152 regulates the second boosted voltage $V_{BOOST2}$.

With reference back to FIG. 2, the first envelope tracking amplifier 58 may be controlled by a first envelope tracking controller 166 to amplify the first RF signal 62 based on a first envelope tracking feedback signal 168. Likewise, the second envelope tracking amplifier 60 can be controlled by a second envelope tracking controller 170 to amplify the second RF signal 68 based on a second envelope tracking feedback signal 172.

The first RF signal 62 may include a first low-band RF signal 174 and a first mid-band RF signal 176. As such, the first RF transmission circuit 66 may include a first low-band transmission circuit 178 and a first mid-band transmission circuit 180 configured to transmit the first low-band RF signal 174 and the first mid-band RF signal 176, respectively.

The second RF signal 68 may include a second mid-band RF signal 182 and a second high-band RF signal 184. As such, the second RF transmission circuit 72 may include a second mid-band transmission circuit 186 and a second high-band transmission circuit 188 configured to transmit the second mid-band RF signal 182 and the second high-band RF signal 184, respectively.

Those skilled in the art will recognize improvements and modifications to the embodiments of the present disclosure. All such improvements and modifications are considered within the scope of the concepts disclosed herein and the claims that follow.

What is claimed is:

1. An envelope tracking power management circuit, comprising:
    at least one first envelope tracking amplifier configured to amplify at least one first radio frequency (RF) signal based on a first supply voltage received on a first supply voltage input for transmission from at least one first RF transmission circuit in at least one first RF carrier;
    at least one second envelope tracking amplifier configured to amplify at least one second RF signal based on a second supply voltage received on a second supply voltage input for transmission from at least one second RF transmission circuit in at least one second RF carrier; and
    a power management circuit configured to:
        determine a selected envelope tracking amplifier among the at least one first envelope tracking amplifier and the at least one second envelope tracking amplifier, wherein the selected envelope tracking amplifier receives a respective supply voltage lower than a voltage required to amplify a respective RF signal to a predetermined voltage; and
        provide a boosted voltage to a respective supply voltage input of the selected envelope tracking amplifier, wherein the boosted voltage is greater than or equal to the voltage required to amplify the respective RF signal to the predetermined voltage.

2. The envelope tracking power management circuit of claim 1, wherein the power management circuit is configured to:
    determine that the at least one first envelope tracking amplifier receives the first supply voltage lower than the voltage required to amplify the at least one first RF signal to the predetermined voltage; and
    provide the boosted voltage to the first supply voltage input of the at least one first envelope tracking amplifier to amplify the at least one first RF signal to the predetermined voltage.

3. The envelope tracking power management circuit of claim 1, wherein the power management circuit is configured to:
    determine that the at least one second envelope tracking amplifier receives the second supply voltage lower than the voltage required to amplify the at least one second RF signal to the predetermined voltage; and
    provide the boosted voltage to the second supply voltage input of the at least one second envelope tracking amplifier to amplify the at least one second RF signal to the predetermined voltage.

4. The envelope tracking power management circuit of claim 1, wherein the power management circuit comprises:
    first voltage boost circuitry configured to:
        generate a first boosted voltage higher than the first supply voltage; and
        provide the first boosted voltage to a first boosted voltage output; and
    second voltage boost circuitry configured to:
        generate a second boosted voltage higher than the second supply voltage; and
        provide the second boosted voltage to a second boosted voltage output.

5. The envelope tracking power management circuit of claim 4, wherein:
    the first boosted voltage is less than or equal to two times the first supply voltage; and
    the second boosted voltage is less than or equal to two times the second supply voltage.

6. The envelope tracking power management circuit of claim 4, wherein the power management circuit further comprises:
    first buck circuitry configured to generate a first electrical current based on a first input voltage and provide the first electrical current to the at least one first RF transmission circuit; and
    second buck circuitry configured to generate a second electrical current based on a second input voltage and provide the second electrical current to the at least one second RF transmission circuit.

7. The envelope tracking power management circuit of claim 6, wherein the power management circuit further comprises:
    first switcher circuitry coupled to the first voltage boost circuitry and the first buck circuitry; and
    second switcher circuitry coupled to the second voltage boost circuitry and the second buck circuitry.

8. The envelope tracking power management circuit of claim 7, wherein the power management circuit further comprises at least one control circuit communicatively coupled to the first switcher circuitry and the second switcher circuitry.

9. The envelope tracking power management circuit of claim 8, wherein the at least one control circuit is configured to:
    determine that the at least one first envelope tracking amplifier receives the first supply voltage lower than the voltage required to amplify the at least one first RF signal to the predetermined voltage; and
    couple the second boosted voltage output of the second voltage boost circuitry to the first supply voltage input of the at least one first envelope tracking amplifier to provide the second boosted voltage to the at least one first envelope tracking amplifier.

10. The envelope tracking power management circuit of claim 9, wherein the power management circuit further comprises first low drop-off output (LDO) circuitry configured to provide the first supply voltage and the second boosted voltage to the first supply voltage input.

11. The envelope tracking power management circuit of claim 9, wherein the power management circuit further comprises:
low drop-off output (LDO) circuitry configured to provide the first supply voltage to the first supply voltage input; and
boosted LDO circuitry configured to provide the second boosted voltage to the first supply voltage input.

12. The envelope tracking power management circuit of claim 9, wherein the power management circuit further comprises a p-type metal-oxide semiconductor field-effect transistor (pMOSFET) configured to regulate the second boosted voltage.

13. The envelope tracking power management circuit of claim 9, wherein the at least one control circuit is further configured to:
control the first switcher circuitry to provide the first supply voltage to the first buck circuitry as the first input voltage; and
control the second switcher circuitry to provide the second supply voltage to the second buck circuitry as the second input voltage.

14. The envelope tracking power management circuit of claim 8, wherein the at least one control circuit is configured to:
determine that the at least one second envelope tracking amplifier receives the second supply voltage lower than the voltage required to amplify the at least one second RF signal to the predetermined voltage; and
couple the first boosted voltage output of the first voltage boost circuitry to the second supply voltage input of the at least one second envelope tracking amplifier to provide the first boosted voltage to the at least one second envelope tracking amplifier.

15. The envelope tracking power management circuit of claim 14, wherein the power management circuit further comprises second low drop-off output (LDO) circuitry configured to provide the second supply voltage and the first boosted voltage to the second supply voltage input.

16. The envelope tracking power management circuit of claim 14, wherein the power management circuit further comprises:
low drop-off output (LDO) circuitry configured to provide the second supply voltage to the second supply voltage input; and
boosted LDO circuitry configured to provide the first boosted voltage to the second supply voltage input.

17. The envelope tracking power management circuit of claim 14, wherein the power management circuit further comprises a p-type metal-oxide semiconductor field-effect transistor (pMOSFET) configured to regulate the first boosted voltage.

18. The envelope tracking power management circuit of claim 14, wherein the at least one control circuit is further configured to:
control the first switcher circuitry to provide the first supply voltage to the first buck circuitry as the first input voltage t; and
control the second switcher circuitry to provide the second supply voltage to the second buck circuitry as the second input voltage.

19. The envelope tracking power management circuit of claim 1, wherein:
the at least one first RF signal comprises a first low-band RF signal and a first mid-band RF signal;
the at least one first RF transmission circuit comprises a first low-band transmission circuit and a first mid-band transmission circuit configured to transmit the first low-band RF signal and the first mid-band RF signal, respectively;
the at least one second RF signal comprises a second mid-band RF signal and a second high-band RF signal; and
the at least one second RF transmission circuit comprises a second mid-band transmission circuit and a second high-band transmission circuit configured to transmit the second mid-band RF signal and the second high-band RF signal, respectively.

20. An envelope tracking power management circuit, comprising:
at least one first envelope tracking amplifier configured to amplify at least one first radio frequency (RF) signal based on a first supply voltage received on a first supply voltage input for transmission from at least one first RF transmission circuit in at least one first RF carrier;
at least one second envelope tracking amplifier configured to amplify at least one second RF signal based on a second supply voltage received on a second supply voltage input for transmission from at least one second RF transmission circuit in at least one second RF carrier; and
a power management circuit configured to:
determine that the at least one first envelope tracking amplifier receives the first supply voltage lower than a voltage required to amplify the at least one first RF signal to a predetermined voltage; and
provide a boosted voltage to the first supply voltage input of the at least one first envelope tracking amplifier, wherein the boosted voltage is greater than or equal to the voltage required to amplify the at least one first RF signal to the predetermined voltage.

* * * * *

UNITED STATES PATENT AND TRADEMARK OFFICE
CERTIFICATE OF CORRECTION

PATENT NO. : 9,973,147 B2
APPLICATION NO. : 15/479832
DATED : May 15, 2018
INVENTOR(S) : Nadim Khlat Page 1 of 1

It is certified that error appears in the above-identified patent and that said Letters Patent is hereby corrected as shown below:

In the Specification

In Column 5, Line 45, replace "circuit to boost" with --circuit 10 to boost--.

Signed and Sealed this
Twenty-sixth Day of June, 2018

Andrei Iancu
*Director of the United States Patent and Trademark Office*